US011232648B1

United States Patent
Bürg et al.

(10) Patent No.: US 11,232,648 B1
(45) Date of Patent: Jan. 25, 2022

(54) SYSTEMS, METHODS, AND MEDIA FOR MODIFYING A MESH FOR A MATERIAL POINT METHOD UTILIZED FOR GEOTECHNICAL ENGINEERING

(71) Applicant: Bentley Systems, Incorporated, Exton, PA (US)

(72) Inventors: Markus Bürg, Delft (NL); Liang Jin Lim, Kuantan (MY)

(73) Assignee: Bentley Systems, Incorporated, Exton, PA (US)

( * ) Notice: Subject to any disclaimer, the term of this patent is extended or adjusted under 35 U.S.C. 154(b) by 0 days.

(21) Appl. No.: 17/101,556

(22) Filed: Nov. 23, 2020

(51) Int. Cl.
*G06T 19/20* (2011.01)
*G06T 17/20* (2006.01)

(52) U.S. Cl.
CPC ............ *G06T 19/20* (2013.01); *G06T 17/205* (2013.01); *G06T 2210/12* (2013.01); *G06T 2219/2004* (2013.01); *G06T 2219/2016* (2013.01)

(58) Field of Classification Search
None
See application file for complete search history.

(56) References Cited

U.S. PATENT DOCUMENTS

| | | | | |
|---|---|---|---|---|
| 7,167,816 | B1 * | 1/2007 | Olovsson | G06T 17/20 703/1 |
| 10,482,201 | B2 * | 11/2019 | Hongo | G06F 30/23 |
| 2016/0210384 | A1 * | 7/2016 | Stomakhin | G06F 30/20 |
| 2019/0250580 | A1 * | 8/2019 | Hebrard | B23C 3/36 |
| 2020/0302672 | A1 * | 9/2020 | Teran | G06T 13/80 |

OTHER PUBLICATIONS

Liang, Yong, Xiong Zhang, and Yan Liu. "An efficient staggered grid material point method." Computer Methods in Applied Mechanics and Engineering 352 (2019): 85-109.*
Ceccato, Francesca. "Study of large deformation geomechanical problems with the material point method." (2015).*
Reusken: Analysis of an extended pressure finite element space for two-phase incompressible flows, J. Comp. Phys. 233, pp. 227-240, Apr. 2008.
E. Burman: Ghost penalty, Comptes Rendus Mathématique 348, pp. 1217-1220, May 12, 2010.

* cited by examiner

*Primary Examiner* — Ryan M Gray
(74) *Attorney, Agent, or Firm* — Cesari and McKenna, LLP

(57) ABSTRACT

In an example embodiment, a process may calculate a fill ratio for each element in the background mesh. The process may identify partially filled elements of the background mesh based on the calculated fill ratios. The process may transform each partially filled element to an empty or filled element by identifying a node of the partially filled element and moving the identified node to a different location in the background mesh. The process may generate an updated background mesh, that includes only empty and filled elements, that may be utilized to perform one or more calculations for one or more time steps in a modeling/simulation environment to simulate a behavior of a physical material/object that may exhibit deformations.

20 Claims, 14 Drawing Sheets

SYSTEMS, METHODS, AND MEDIA FOR MODIFYING A MESH FOR A MATERIAL POINT METHOD UTILIZED FOR GEOTECHNICAL ENGINEERING

BACKGROUND

Technical Field

The present disclosure relates generally to geotechnical engineering, and more specifically to systems, methods, and media for modifying a mesh for a material point method utilized for geotechnical engineering.

Background Information

Geotechnical engineering is the application of scientific methods and engineering principles to the acquisition, interpretation, and use of knowledge of materials of the Earth's crust and earth materials for the solution of engineering problems and the design of engineering works. Geotechnical engineering may be used to predict a behavior of the Earth, its various materials and processes towards making the Earth more suitable for human activities and development. Geotechnical engineering may utilize the fields of soil mechanics and rock mechanics, and may have applications in the fields of geology, geophysics, hydrology, and other related sciences. Examples of the application of geotechnical engineering may include, but are not limited to, prediction, prevention or mitigation of damage caused by natural hazards such as avalanches, mud flows, landslides, rockslides, sinkholes, and volcanic eruptions; the application of soil, rock and groundwater mechanics to the design and predicted performance of earthen structures such as dams; the design and performance prediction of foundations of bridges, buildings, and other man-made structures in terms of the underlying soil and/or rock; and flood control and prediction.

The Material Point Method (MPM) is a technique that may be utilized in geotechnical engineering and, specifically, in geotechnical modeling and numerical analysis. For example, the MPM may be utilized to analyze large deformation behaviors of soils, structures and fluids, and their interactions, such as internal and external erosion, and post-liquefaction analysis; for instance the post-failure liquid-like behaviors of landslides, penetration problems such as the cone penetration test (CPT) and pile installation, and scouring problems related to underwater pipelines.

The MPM is considered a "meshless" spatial discretization strategy because a continuum is not mapped with a rigid mesh, but is instead divided into material points, for a discretized physical material/object, that move along an arbitrary background mesh that may comprise a plurality of elements and that may not hold state variables. As such, the MPM may be well suited for dealing with problems that involve large deformations of the physical material/object e.g., soils, structures and fluids, and their interactions. The material points associated with the MPM (sometimes called particles) carry information (e.g., mass, volume, stress, state variables, etc.) and are cast over the background mesh including the elements having a shape and size defined by nodes and edges. The information is mapped to the nodes of the background mesh utilizing, for example, shape functions. Calculations, e.g., equilibrium calculations, may be carried out utilizing a solver, e.g., matrix solver, during simulation in a modeling/simulation environment that may simulate deformations of the physical material/object. The results of the calculations may be mapped back to the material points, using the same shape functions, and the background mesh may be discarded. With conventional techniques, this cycle may be repeated over a plurality of time steps using a reset background mesh to perform the calculations.

As the material points move through the background mesh during simulation, some elements of the background mesh may be partially filled with material points, while other elements may be empty or filled with material points. With some conventional techniques, the elements that are partially filled with material points may cause for inaccurate results of the calculations during simulation. In addition or alternatively, the elements that are partially filled may even cause instability such that the solver fails and the calculations cannot be performed during simulation.

SUMMARY

In one or more embodiments, the disclosed systems, methods, and media include modifying a mesh for a material point method (MPM). Specifically, a process, e.g., an application executing on a device, may transform each identified partially filled element of the mesh, i.e., background mesh, to either an empty element or a filled element to generate an updated background mesh. The updated background mesh may be utilized during one or more time steps to simulate, in a modeling/simulation environment, a behavior of a physical material/object that exhibits deformations.

More specifically, the process may calculate a fill ratio for each element in the background mesh, where the fill ratio may indicate how much of a total area of an element is filled with material points. The process may determine if each element in the background mesh is either empty, filled, or partially filled based on the calculated fill ratio. For example, if the calculated fill ratio for an element is less than or equal to a lower threshold value, the element may be defined as being empty. If the calculated fill ratio for an element is equal to or greater than an upper threshold value, the element may be defined as being filled. If the calculated fill ratio for an element is greater than the lower threshold value and less than the upper threshold value, the element may be defined as being partially filled. The process may mark each identified partially filled element. For example, each element of the background mesh may be assigned or have an associated unique identifier, e.g., number. The process may add the unique identifiers of the elements that are determined to be partially filled to a data structure, e.g., a list, to mark the partially filled elements such that each partially filled element can be processed, e.g., transformed to an empty element or filled element.

The process may transform each identified partially filled element to either an empty element or a filled element. For example, the process may transform a partially filled element to either an empty element or a filled element based on determining how far each node of the partially filled element would have to move to transform the partially filled element to an empty element. In an implementation, if the distance that at least one node would have to move to transform the partially filled element to an empty element is less than a distance threshold value, the process may determine that the partially filled element should be transformed to an empty element. In an implementation, if the distance that each of the nodes would have to move to transform the partially filled element to an empty element is equal to or greater than the distance threshold value, the process may determine that the partially filled element should be transformed to a filled element.

If the partially filled element is to be transformed to an empty element, the process may identify a node, of a plurality of nodes of the partially filled element, that is to be moved to transform the partially filled element to an empty element. In an implementation, the process may identify the node to be moved as a node that has to move a shortest distance to transform the partially filled element to an empty element.

The process may move the identified node from its location to a different location to transform the partially filled element to an empty element.

If the partially filled element is to be transformed to a filled element, the process may identify a node, of a plurality of nodes of the partially filled element, that is to be moved to transform the partially filled element to a filled element. In an implementation, the process may identify the node to be moved as a node that is a farthest distance away from any of the material points contained in the partially filled element. The process may move the identified node from its location to a different location to transform the partially filled element to a filled element.

The process as described above may be iterated, or looped over, until each partially filled element is transformed to either an empty element or a filled element such that an updated background mesh is generated that only includes empty elements and filled elements as defined by the calculated fill ratios. The updated background mesh may be utilized to perform one or more calculations during one or more time steps to simulate, in a modeling/simulation environment, a behavior of a material/object that exhibits deformations.

By using the updated background mesh that includes only empty and filled elements to perform the calculations during time steps of a simulation, the one or more embodiments described herein improve accuracy of results of the calculations and/or stability to perform the calculations during simulation when compared to conventional techniques that, for example, may utilize a background mesh with partially filled elements that may lead to inaccurate results and/or instability. Because the accuracy of results and stability during simulation are improved, the size of the time steps may be increased during simulation, which in turn results in a reduced number of calculations having to be performed during the simulation (i.e., less number of calculations have to be performed when compared to conventional techniques). Because less calculations have to be performed, the one or more embodiments described herein conserve processing resources of a computer, e.g., device, that executes the simulation and performs the calculations. As such, the one or more embodiments described herein provide an improvement to a computer, e.g., a device that executes the simulation and performs the calculations, itself.

BRIEF DESCRIPTION OF THE DRAWINGS

The description below refers to the accompanying drawings, of which.

DETAILED DESCRIPTION OF AN ILLUSTRATIVE EMBODIMENT

Figure 1:
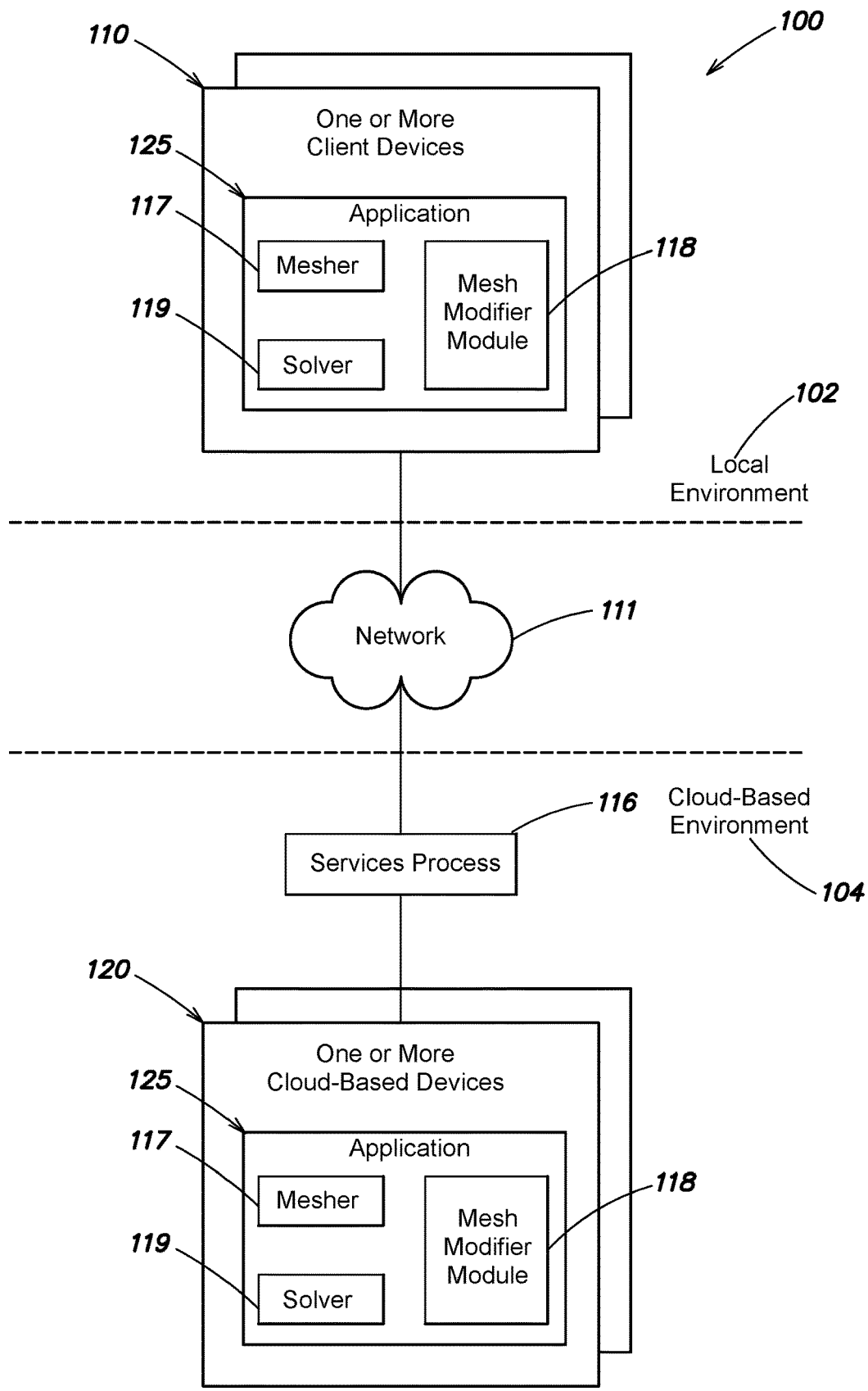
FIG. 1 is a high-level block diagram of an example architecture for modifying a background mesh for a material point method utilized for geotechnical engineering according to one or more embodiments described herein.

FIG. 1 is a high-level block diagram of an example architecture 100 for modifying a background mesh for a material point method utilized for geotechnical engineering according to one or more embodiments described herein. The architecture 100 may be divided into a local environment 102 that includes one or more local client devices 110 that are local to an end-user, and a cloud-based environment 104 that includes one or more cloud-based client devices 120 that are remote from the end-user and that are accessible to the end-user via a network 111 (e.g., the Internet). Each computing device, e.g., one or more local client devices 110 and one or more cloud-based client devices 120, may include processors, memory/storage, a display screen, and other hardware (not shown) for executing software, storing data and/or displaying information. A local client device 110 may provide a variety of user interfaces and non-processing intensive functions. For example, a local client device 110 may provide a user interface, e.g., a graphical user interface and/or a command line interface, for receiving user input and displaying output according to the one or more embodiments described herein. A services process 116 may coordinate operation of the one or more local client devices 110 and the one or more cloud-based client devices 120 such that, for example, the one or more local client devices 110 may communicate with and access the one or more cloud-based client devices 120 via network 111.

The one or more client devices 110 and/or one or more cloud-based client devices 120 may store and execute application 125 that may modify a mesh, i.e., a background mesh, for a material point method (MPM) according to one or more embodiments described herein. In an embodiment, the application 125 may be geotechnical engineering software that includes a modeling/simulation environment that may simulate a behavior of a physical material/object that exhibits deformations. In an embodiment, application 125 is the PLAXIS software available from Bentley Systems, Inc.

In an implementation, the one or more local client devices 110 may download and store application 125 that modifies the background mesh for the MPM according to the one or more embodiments described herein. In an implementation, the one or more local client devices 110 may utilize one or more user interfaces to access, via services process 116, the application 125 that is stored on the one or more cloud-based client devices 120 and that modifies the background mesh for the MPM according to the one or more embodiments described herein.

The application 125 may include a mesher 117, a mesh modifier module 118, and a solver 119. The mesher 117 may create a background mesh based on information (e.g., a geometrical description, model parameters/conditions for a model that includes the material points 310 and represents the physical material/object in the modeling/simulation environment) that may be provided by an end-user utilizing a user interface of the local client device 110.

The mesh modifier module 118 may generate an updated background mesh by identifying and transforming each partially filled element of the background mesh to either an empty element or a filled element according to the one or more embodiments described herein and as described in further detail below. The solver 119 may utilize information (e.g., mass, volume, stress, state variables, etc.) of the material points and the information provided via the one or more user interfaces with the updated background mesh to perform one or more calculations to simulate a behavior of the physical material/object that may exhibit deformations. In an implementation, results (e.g., tables, graphics, etc.) of the calculations performed during simulation may be displayed via the user interfaces of the local client device 110 such that the end-user may interact with the results utilizing, for example, the user interfaces.

Although FIG. 1 depicts the mesher 117, mesh modifier module 118, and solver 119 being separate entities of application 125, it is expressly contemplated that the functionalities of mesher 117, mesh modifier module 118, and solver 119 may be performed by a single entity/process according to the one or more embodiments described herein.

Figure 2:
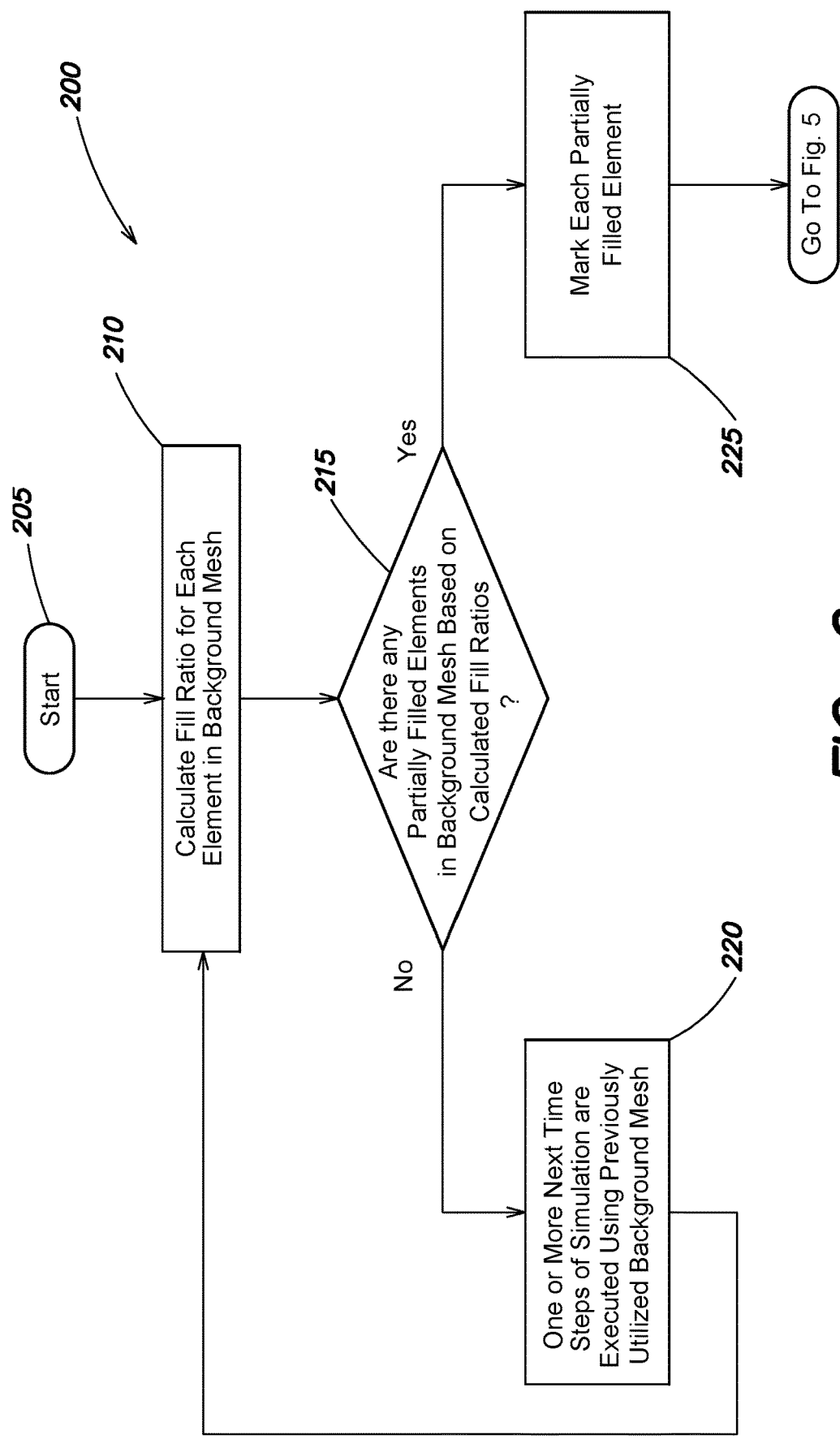
FIG. 2 is a flow diagram of a sequence of steps for identifying elements of a background mesh that are partially filled elements according to one or more embodiments described herein.

FIG. 2 is a flow diagram of a sequence of steps for identifying elements of a background mesh that are partially filled elements according to the one or more embodiments described herein. Specifically, the mesh modifier module 118 may identify elements of a background mesh that are partially filled elements as described with reference to the flow diagram of FIG. 2, such that each of the identified partially filled elements may be transformed to an empty or a filled element to generate an updated background mesh as described later with reference to FIG. 5.

Figure 3:
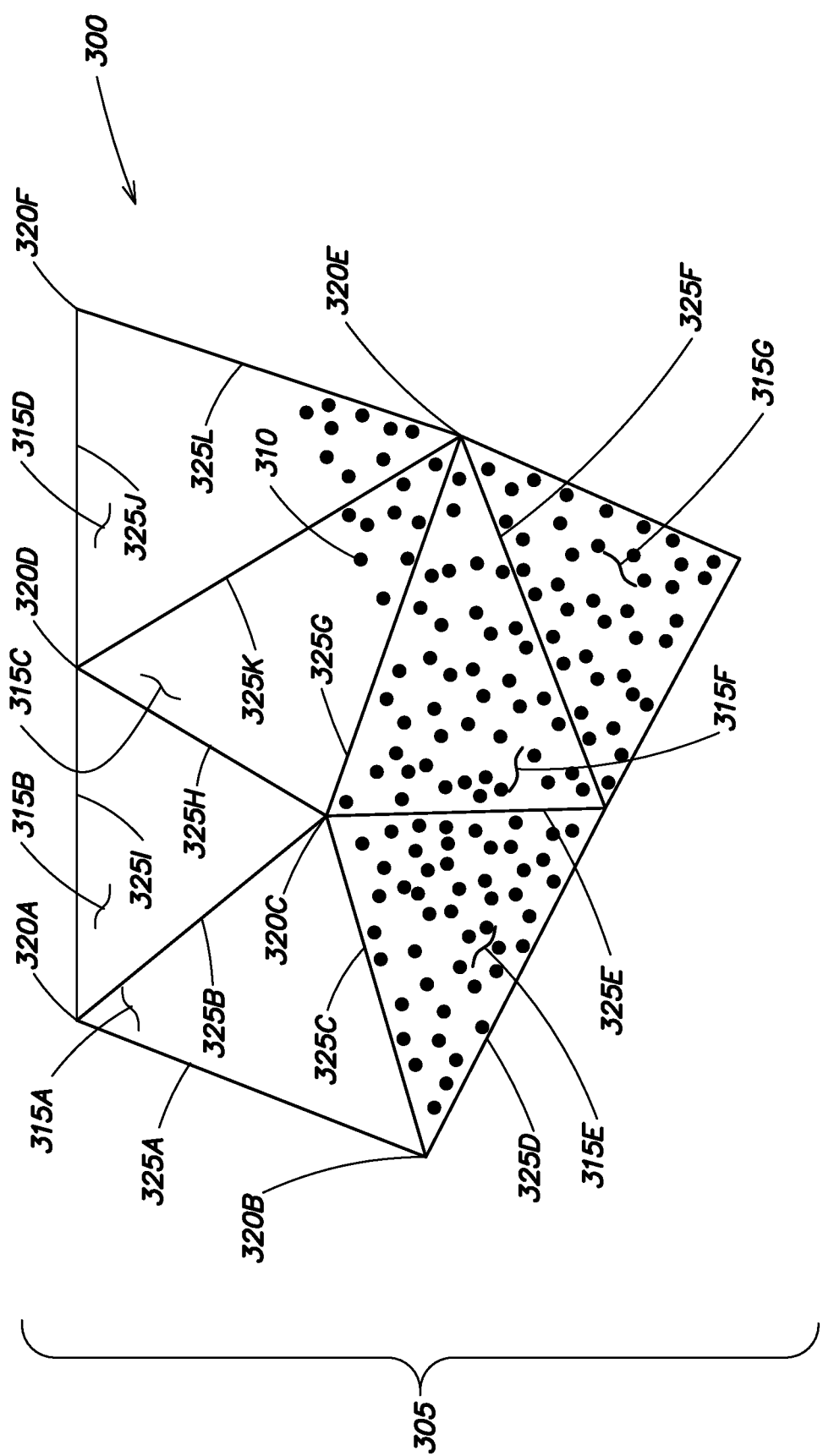
FIG. 3 is a diagram illustrating example input data that includes a background mesh with material points that may be contained within one or more elements of the background mesh according to one or more embodiments described herein.

The procedure 200 starts at step 205 and continues to step 210 where mesh modifier module 118 calculates a fill ratio for each element in a background mesh. FIG. 3 is a diagram illustrating example input data 300 that includes a background mesh 305 with material points 310 that may be contained within one or more elements 315A-G according to one or more embodiments described herein. The material points 310 collectively may be referred to as a point cloud or a material point cloud that may be stored at the client device 110 and/or cloud-based device 120. In an embodiment, a physical material/object that exhibits deformations is discretized by the material points 310 and the material points 310 on the boundary of the point cloud may represent an external surface of the physical material/object in space. For simplicity and ease of understanding, reference number 310 in FIG. 3 refers to a single material point, but it is expressly contemplated that each material point in FIG. 3 may be associated with reference number 310. As depicted in FIG. 3, elements 315A-B are empty, while elements 315C-G include material points. In addition, each element 315A-G of the background mesh 305 is, in this example, a triangle. The size, shape, and perimeter of each element 315A-G may be defined by edges 325A-L and nodes 320A-F of the background mesh 305, where the nodes 320A-F may connect the elements 315A-G and indicate where the elements 315A-G meet.

In an embodiment, mesher 117 may create background mesh 305 based on information (e.g., a geometrical description, model parameters/conditions for a model that includes the material points 310 and represents the physical material/object in the modeling/simulation environment) that may be provided by an end-user utilizing a user interface of the local client device 110. Application 125, e.g., solver 119 of application 125, may execute and perform one or more calculations to simulate a behavior of the physical material/object, that may exhibit deformations, over one or more time intervals, i.e., time steps.

Although elements 315A-G are triangles in FIG. 3, it is expressly contemplated that the elements as described herein may be different geometric shapes, e.g., squares, rectangles, etc., that may be utilized in accordance with the one or more embodiments described herein. In addition, although FIG. 3 depicts a background mesh 305 that includes 7 elements, e.g., elements 315A-G, it is expressly contemplated that larger and more complex background meshes may be utilized in accordance with the one or more embodiments described herein.

With reference to FIG. 3, the mesh modifier module 118 may calculate a fill ratio for each of the plurality of elements 315A-G to determine if each of the plurality of elements 315A-G is either empty, filled, or partially filled according to the one or more embodiments described herein. The fill ratio may be a value that indicates how much of a total area of an element, e.g., element 315A, is filled with material points. For example, the fill ratio may be a percentage value that indicates what percentage of the total area of the element, e.g., 315A, is filled with material points. In an implementation, the fill ratio may be defined as a quotient between an area of a portion of an element that is filled with material points and the total area of the element. For example, the fill ratio (Fill$_R$) may be calculated as:

$$Fill_R = \frac{A_{fill}}{A},$$

where A$_{fill}$ is the area of the portion of the element that is filled with material points and A is the total or overall area of the element. In an implementation, the mesh modifier module 118 may calculate A by integrating over an element as:

$$A = \int_\Delta,$$

where Δ represents an element, i.e., the integration area.

To calculate A$_{fill}$ for an element, the mesh modifier module 118 may utilize a level-set method. The level-set method, as known by those skilled in the art, may be a conceptual framework for using level sets as a tool for numerical analysis of surfaces and shapes. According to one or more embodiments describe herein, a level-set field may be a continuous field that is negative inside the material point cloud that includes material points 310 and positive outside the material point cloud. In an implementation, a signed distance function may be an example of a level-set field that may be utilized with respect to a surface of a material point cloud to calculate A$_{fill}$. For example, a signed distance function may determine a distance of any given point from a boundary, e.g., the surface of the material point cloud, where the sign of the determined distance may be based on whether the given point is inside or outside of the material point cloud. Specifically, the signed distance function may have positive values for points outside the material point cloud, may have decreasing positive values as points approach the boundary where the signed distance function is zero, and may have negative values inside the material point cloud.

Figure 4:
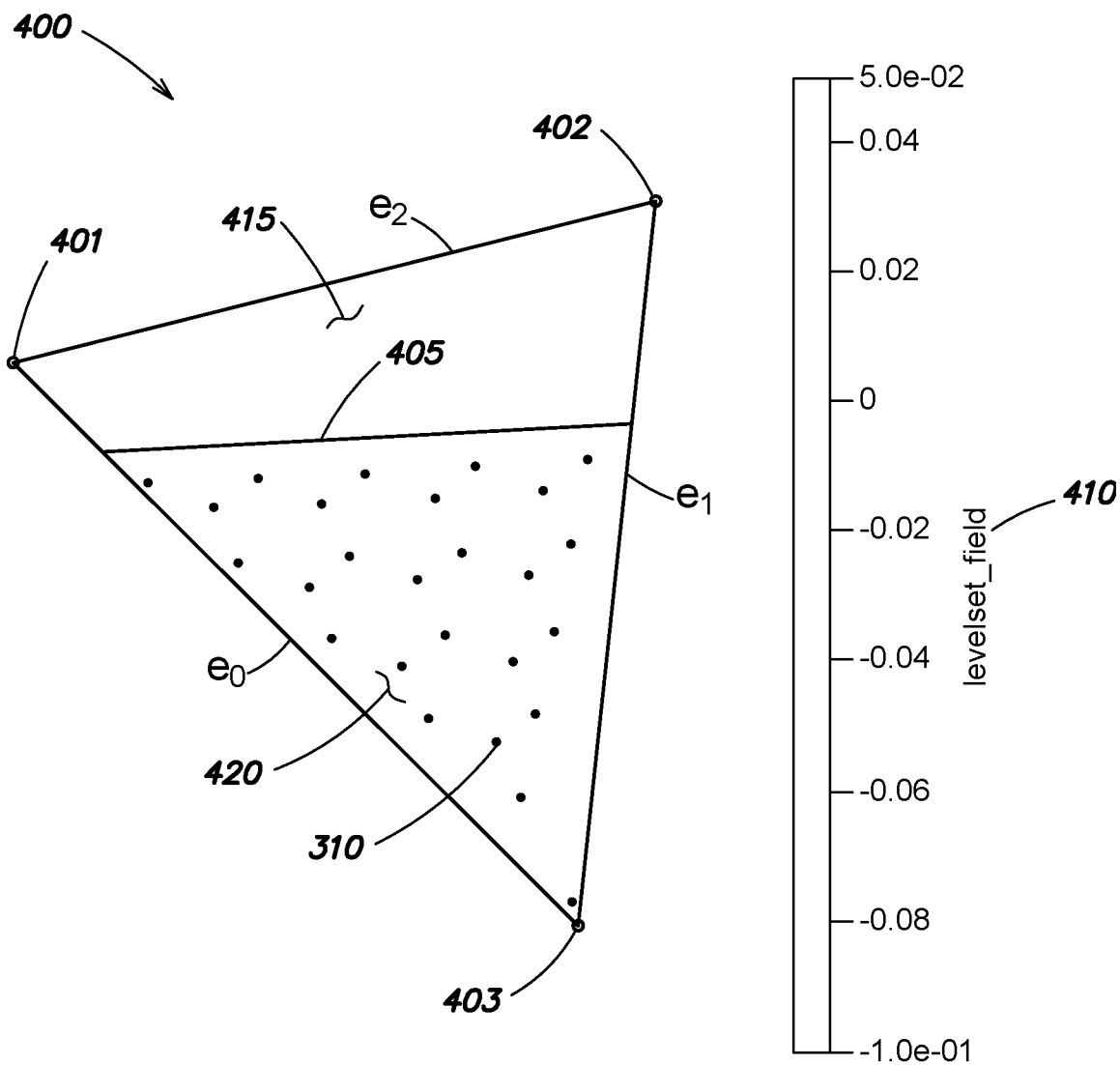
FIG. 4 is a diagram illustrating an example for using a level-set method to calculate an area of a filled portion of a partially filled element according to one or more embodiments described herein.

FIG. 4 is a diagram illustrating an example for using a level-set method to calculate an area of a filled portion of a partially filled element 400 according to one or more embodiments described herein. As depicted in FIG. 4, the partially filled element 400 includes edges e$_0$, e$_1$, and e$_2$, and nodes 401, 402, and 403 that may define a size, shape, and perimeter of the partially filled element 400. The partially filled element 400 may also include an empty portion 415 and a filled portion 420 that includes material points 310. Additionally, a zero-contour line 405, i.e., boundary, of a level-set field 410 may be set at a location that defines the surface of the material point cloud, where the level-set field 410 is positive above the zero-contour line 405 and the level-set field 410 is negative below the zero-contour line 405. Therefore, the empty portion 415 that is above the zero-contour line 405 is outside the material point cloud and the filled portion 420 that is below the zero-contour line 405 is inside the material point cloud and includes material points 310.

With the level-set field defined in the manner as depicted in FIG. 4, A$_{fill}$, i.e., an area of the filled portion 420, can be calculated by integrating over the area in which the level-set field (L) is negative, e.g., below the zero-contour line 405. Specifically, A$_{fill}$ may be calculated as:

$$A_{fill} = \int_{\{x \in \Delta : L(x) < 0\}},$$

where x∈Δ: L(x)<0 represents the integration area, and specifically, is a set that contains all points x in an element represent by Δ whose value L(x) is less than zero, e.g., below the zero-contour line.

Accordingly, the mesh modifier module 118 may calculate Fill$_R$ for element 400 based on A$_{fill}$ and A that may be calculated as described above. Additionally, the mesh modifier module 118 may calculate Fill$_R$ for each of the elements of a background mesh, e.g., elements 315A-G of the background mesh 305 of FIG. 3, in a similar manner.

Referring back to FIG. 2, the procedure continues to step 215 and the mesh modifier module 118 determines if there are any partially filled elements in the background mesh based on the calculated fill ratio for each element. In an implementation, each element in the background mesh may be determined to be either empty, filled, or partially filled with material points based on the fill ratios calculated in step 210.

Referring to FIG. 3, each element 315A-G of the background mesh 305 may be determined to be empty, filled, or partially filled with material points based on the calculated fill ratio, Fill$_R$, for each of the elements 315A-G. Specifically, the mesh modifier module 118 may determine that an element is defined as empty when the fill ratio calculated for the element is less than or equal to a lower threshold value. In this example, let it be assumed that the lower threshold value is 0. As such, the mesh modifier module 118 may determine that an element is defined as being empty when the element does not include any material points, e.g., when the fill ratio is equal to 0. Additionally, the mesh modifier module 118 may determine that an element is defined as filled with material points when the fill ratio calculated for the element is equal to or greater than an upper threshold value. In an implementation, the upper threshold value (U$_T$) may be calculated as:

$$U_T = 0.9^d,$$

where d is a space dimension, i.e., d=2 for 2-dimensional space and d=3 for 3-dimensional space. Therefore, and in this example, an element is defined as being filled with material points when 81% of a total area of the element is filled with material points, e.g., when the fill ratio is equal to or greater than U$_T$. In an implementation, the lower and upper threshold values may be based on system design, user preference, etc.

The mesh modifier module 118 may determine that an element is partially filled if the calculated fill ratio for the element is greater than the lower threshold value, e.g., 0, and less than U$_T$, e.g., 0.9$^d$. Accordingly, and referring to FIG. 3, the mesh modifier module 118 may determine that elements 315A and 315B are defined as being empty since elements 315A and 315B do not include any material points, e.g., the fill ratios for elements 315A and 315B are 0. In addition, let it be assumed that the mesh modifier module 118 determines that elements 315E, 315F, and 315G are defined as being filled with material points because the calculated fill ratios for elements 315E, 315F, and 315G are equal to or greater than U$_T$. In addition, let it be assumed that the mesh modifier module 118 determines that elements 315C and 315D are defined as being partially filled with material points because the calculated fill ratios for elements 315C and 315D are greater than the lower threshold value, e.g., 0, and less than U$_T$. Thus, and in this example, there are determined to be two partially filled elements, e.g., 315C and 315D.

If at step 215 it is determined that there are no elements of the background mesh that are partially filled, the procedure continues to step 220 where one or more next time steps of the simulation are executed using a previously utilized background mesh, e.g., a last utilized background mesh. In an implementation, and when a background mesh is modified according to the one or more embodiments described herein, a last modified background mesh may be used to perform the one or more calculations during execution of the one or more next times steps.

If at step 215 it is determined that there is at least one element of the background mesh that is partially filled, the procedure continues to step 225 where the mesh modifier module 118 marks each partially filled element of the background mesh. In this example and with reference to FIG. 3, the mesh modifier module 118 may mark elements 315C and 315D as being partially filled. For example, each element of the elements 315A-G of the background mesh 305 may be assigned or have an associated unique identifier, e.g., number. The mesh modifier module 118 may add the unique identifiers of the elements that are determined to be partially filled to a data structure, e.g., a list, to mark the partially filled elements. Therefore, and in this example, the mesh modifier module 118 may add the unique identifiers of elements 315C and 315D to the list, where the list contains the unique identifiers for one or more elements, each of which is to be processed, e.g., transformed from a partially filled element to either an empty element or a filled element as described in further detail below.

Figure 5:
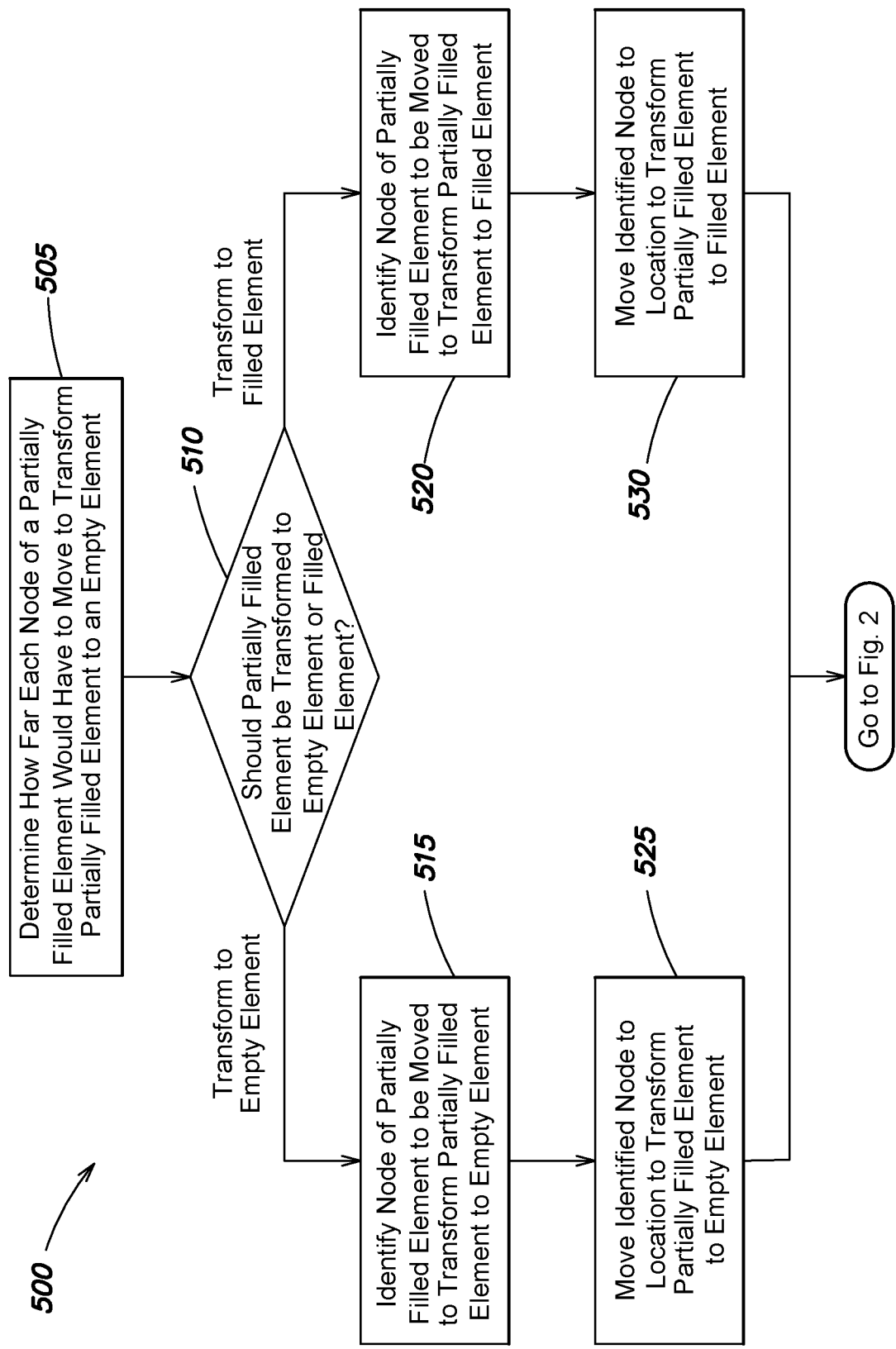
FIG. 5 is a flow diagram of a sequence of steps for identifying and moving a node of a partially filled element of a background mesh to transform the partially filled element to an empty element or a filled element according to the one or more embodiments described herein.

From step 225, the procedure continues to step 505 of procedure 500 of the flow diagram of FIG. 5. FIG. 5 is a flow diagram of a sequence of steps for identifying and moving a node of a partially filled element of the background mesh to transform the partially filled element to an empty element or a filled element according to the one or more embodiments described herein. Although FIG. 5 may at times refer to a single partially filled element, it is expressly contemplated that procedure 500 of FIG. 5 may be applied in parallel or serially to each of the plurality of identified partially filled elements of a background mesh according to the one or more embodiments described herein.

As an example and referring to partially filled element 400 of FIG. 4, node 401 or 402 may be moved (e.g., moved down) to, or in close proximity to, the zero-contour line 405 to decrease the size of the empty portion 415 such that the partially filled element 400 is transformed to a filled element and the empty portion 415 is moved to one or more neighboring elements (not shown). Alternatively, node 403 may be moved (e.g., moved up) to, or in close proximity to, the zero-contour line 405 to decrease the size of the filled portion 420 such that the partially filled element 400 is transformed to an empty element and the material points 310 that were in partially filled element 400 are moved to one or more neighboring elements (not shown).

To determine if a partially filled element is to be transformed to an empty element or a filled element, the mesh modifier module 118, at step 505, determines how far each node of the partially filled element would have to move to transform the partially filled element to an empty element. Specifically, and referring to FIG. 4, the mesh modifier module 118 may determine a bounding box for each node 401, 402, and 403 such that the bounding box includes all the material points 310. For example the bounding box determined for node 403 may be a minimum bounding box where node 403 is located at a center of the minimum bounding box and all the material points 310 are within the minimum bounding box.

A size of the bounding box determined for each node 401, 402, and 403 may then be utilized to determine how far each of nodes 401, 402, and 403 would have to move to transform the partially filled element 400 to an empty element as described in further detail below.

Figure 6:
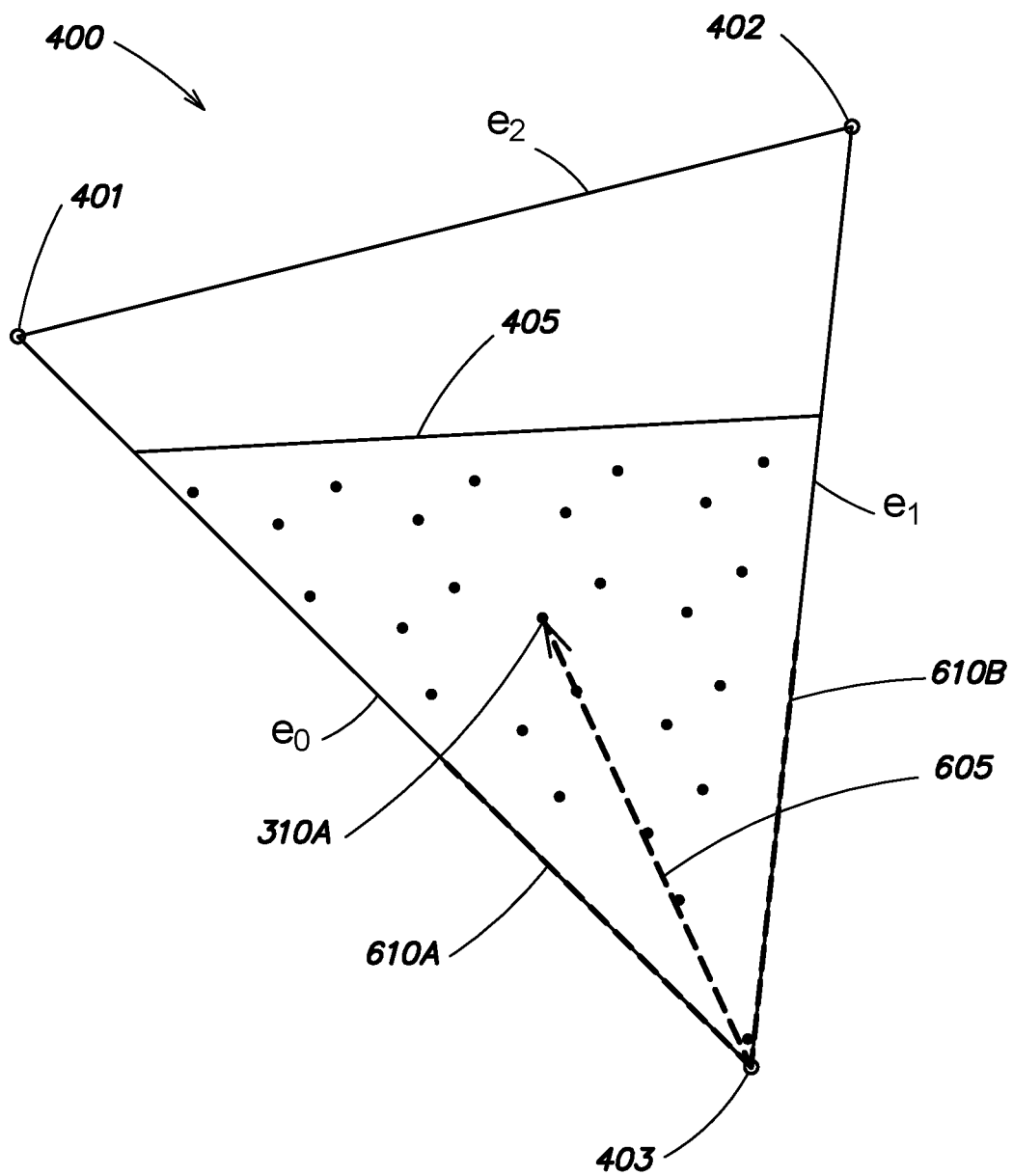
FIG. 6 is a diagram illustrating an example for determining a bounding box for a node of the partially filled element of FIG. 4 according to one or more embodiments described herein.

FIG. 6 is a diagram illustrating an example for determining a bounding box for a node, e.g., node 403, of the partially filled element 400 of FIG. 4 according to one or more embodiments described herein. Specifically, FIG. 6 depicts a connecting vector 605 that may be generated, by the mesh modifier module 118, between node 403 and a material point 310A of all material points 310 contained in partially filled element 400. The mesh modifier module 118 may then project the generated connecting vector 605 on edges $e_0$ and $e_1$ that are connected to node 403 to respectively generate projected vectors 610A and 610B as indicated by the dash portions over edges $e_0$ and $e_1$, respectively. The length of the projected vectors 610A and 610B with respect to the length of the edges $e_0$ and $e_1$ may represent coordinates (e.g., x and y coordinates) of an upper-right corner (U) of a bounding box for node (N) 403 and the material point (p) 310A. In an implementation, U may be calculated as:

$$U = \frac{\overline{LNp} \cdot e_0}{Le_0}, \frac{\overline{LNp} \cdot e_1}{Le_1},$$

where $\overline{LNp} \cdot e_0$ is the length of the projected vector 610A that is projected over edge $e_0$ that is connected to node 403, $\overline{LNp} \cdot e_1$ is the length of the projected vector 610B that is projected over edge $e_1$ that is connected to node 403, $Le_0$ is the length of edge $e_0$, and $Le_1$ is the length of edge $e_1$. In an implementation, a position of node 403 may be at a center of the bounding box. In an implementation, the coordinates of node 403 may be [0,0].

In the example above, U includes x and y coordinates because partially filled element 400 is in a 2-dimensional space. However, it is expressly contemplated that if partially filled element 400 was in a 3-dimensional space, U can be calculated in a similar manner as described above such that U would include x, y, and z coordinates. As such, it is expressly contemplated that although the examples described herein may refer to a 2-dimensional space, it is expressly contemplated that the one or more embodiments described herein may be performed in a higher dimensional space.

As depicted in FIG. 6, the material point 310A is approximately in the middle of filled portion 420. Accordingly, the bounded box that may be generated for node 403 and material point 310A may not include all the material points 310 of the partially filled element 400, e.g., the bounded box would not include some material points between material point 310A and zero-contour line 405.

Therefore, the mesh modifier module 118 may calculate, for node 403, U for each of the material points 310 of the partially filled element 400 in a similar manner as described above. In an implementation, the mesh modifier module 118 may select a maximum component value, e.g., a maximum of $$\frac{\overline{LNp} \cdot e_0}{Le_0}$$

and a maximum of $$\frac{\overline{LNp} \cdot e_1}{Le_1},$$

from the U values calculated for all the material points 310 of the partially filled element 400.

The selected maximum component values may represent the U of a minimum bounding box for node 403 that includes all the material points 310 and may be referred to as U-final. Thus, U-final may be the coordinates, e.g., x, y coordinates, for the upper right corner of a minimum bounding box for node 403 that includes all the material points 310 of the partially filled element 400. In addition, U-final for node 403 may represent a distance that node 403 would have to move to transform the partially filled element 400 to an empty element. Thus, a new position of node 403 if it were moved to U-final, such that partially filled element 400 is transformed to an empty element, may be equal to the position of node 403 plus U-final.

According to the one or more embodiments described herein, the mesh modifier module 118 may generate U-final$_1$, ... U-final$_n$, where n represents the number of nodes of the partially filled element. As such, and in this example, the mesh modifier module 118 may generate U-final$_1$, U-final$_2$, and U-final$_3$ for nodes 401, 402, and 403 of partially filled element 400 to determine the minimum bounding boxes for nodes 401, 402, and 403 that include all the material points 310 of the partially filled element 400.

Referring back to FIG. 5, the procedure continues to step 510 and the mesh modifier module 118 determines whether a partially filled element should be transformed to an empty element or a filled element. The mesh modifier module 118 may utilize the generated U-final values, e.g., U-final$_1$, U-final$_2$, and U-final$_3$, and a distance threshold value to determine whether the partially filled element 400 should be transformed to an empty element or a filled element. The distance threshold value may represent a maximum distance value that a node should move to transform a partially filled element to an empty element. In an implementation, the distance threshold value may be based on system design, user preference, etc. In an implementation, the distance threshold value may be a value between 0 and 1 and may represent a percentage of an overall length of an edge of a partially filled element, e.g., edges $e_0$, $e_1$, and $e_2$ of partially filled so element 400. For example, the threshold value may be 0.35.

In this example, if the distance that at least one node of nodes 401, 402, and 403 would have to move to transform the partially filled element to an empty element is less than 35%, of an overall length of an edge to which the node is connected, then the partially filled element 400 is to be transformed to an empty element. If the distance that each of nodes 402, 403, and 404 would have to move to transform the partially filled element 400 to an empty element is equal to or greater than 35% of an overall length of an edge to which a node is connected, then the partially filled element 400 is to be transformed to a filled element.

Accordingly, the determination of whether partially filled element 400 is transformed to an empty element or a filled element is based on how far the nodes 401, 402, and 403 of the partially filled element 400 would have to move to transform the partially filled element 400 to an empty element.

Specifically, and in this example, the mesh modifier module 118 may compare the threshold value of 0.35 with each component value, e.g., $$\frac{\overline{LNp} \cdot e_0}{Le_0}$$

and $$\frac{\overline{LNp} \cdot e_1}{Le_1},$$

of U-final$_1$, U-final$_2$, and U-final$_3$. If any component value is less than the threshold value of 0.35, the mesh modifier module 118 may determine that the partially filled element 400 should be transformed to an empty element. Otherwise, if all the component values are equal to or greater than the threshold value of 0.35, the mesh modifier module 118 may determine that the partially filled element should be transformed to a filled element.

Figure 7:
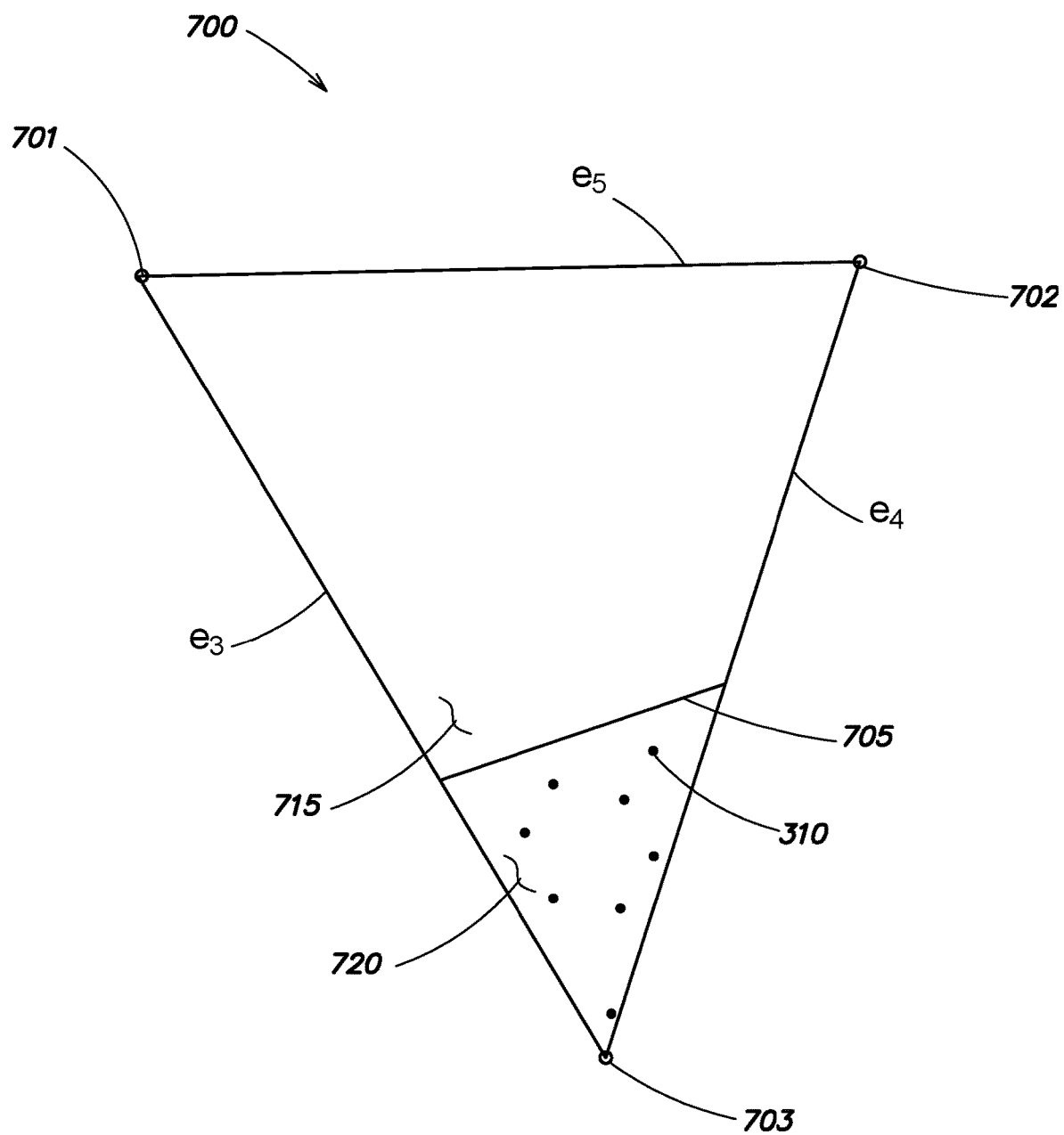
FIG. 7 is a diagram illustrating another partially filled element for identifying a node that is to move a shortest distance to transform the another partially filled element to an empty element according to the one or more embodiments described herein.

If at step 510 it is determined that the partially filled element should be transformed to an empty element, the procedure continues to step 515 and the mesh modifier module 118 identifies a node, of a plurality of nodes of the partially filled element, that is to be moved to transform the partially filled element to an empty element. Specifically, the mesh modifier module 118 may identify the node by determining which node of the plurality of nodes would have to move a shortest distance to transform the partially filled element to an empty element. FIG. 7 is a diagram illustrating another partially filled element 700 for identifying a node that is to move a shortest distance to transform the partially filled element to an empty element according to the one or more embodiments described herein.

As depicted in FIG. 7, the partially filled element 700 includes edges $e_3$, $e_4$, and $e_5$, and nodes 701, 702, and 703 that define the shape, size, and perimeter of the partially filled element 700. The partially filled element 700 also includes an empty portion 715 and a filled portion 720 that includes material points 310. Additionally, a zero-contour line 705, i.e., boundary, may be set at a location that defines the surface of the material point cloud in a similar manner as described above with respect to FIG. 4. Further, the mesh modifier module 118 may determine, in a similar manner as described above with respect to FIG. 4, U-final for each of nodes 701, 702, and 703.

The mesh modifier module 118 may determine a size, e.g., area or volume, for each of the determined bounding boxes, and a node corresponding to a bounding box determined to have a smallest size may be the node that is identified as having to move the shortest distance to transform partially filled element to an empty element.

For example, and referring to FIG. 7, the mesh modifier module 118 may determine U-final$_{701}$ for node 701, U-final$_{702}$ for node 702, and U-final$_{703}$ for node 703 in a similar manner as described above with reference to FIG. 4. The mesh modifier module 118 may compute an L1 Norm value for the bounding box for each node 701, 702, and 703, where the L1 Norm value represents a size of the bounding box. As known by those skilled in the art, the L1 Norm is a technique for measuring distances between vectors that may be a sum of an absolute difference of the components of the vectors. For example, and assuming that node 701 is positioned at [0,0], the L1 Norm value for the bounded box for node 701 would be equal to an addition of the two components of U-final$_{701}$. Similarly, and assuming that node 702 is positioned at [0,0], the L1 Norm value for the bounded box for node 702 would be equal to an addition of the two components of U-final$_{702}$. Further, and assuming that node 703 is positioned at [0,0], the L1 Norm value for the bounded box for node 703 would be equal to an addition of the two components of U-final$_{703}$.

Although the example of FIG. 7 describes partially filled element 700 in a 2-dimensional space, it is expressly contemplated that the one or more embodiments described herein may calculate a size, e.g., area or volume, for a partially filled element in a 3-dimensional space. For example, and in a 3-dimensional space, the L1 Norm value may be calculated by adding the three components of U-final. Furthermore, although the example with reference to FIG. 7 describes calculating the size of the bounding box utilizing the L1 Norm technique, it is expressly contemplated that the size of the bounding box may be calculated in any of a variety of different ways as known by those skilled in the art.

The mesh modifier module 118 may then determine that the node corresponding to a bounding box with the smallest size is the node that would move the shortest distance to transform the partially filled element to an empty element. In this example, let it be assumed that the bounding box corresponding to node 703 has the smallest size when compared to sizes of the bounding boxes corresponding to nodes 701 and 702. As such, the mesh modifier module 118 determines that node 703 of partially filled element 700 is the node that would move the shortest distance to transform partially filled element 700 to an empty element. Therefore, and in this example, node 703 is the identified node.

Figure 8:
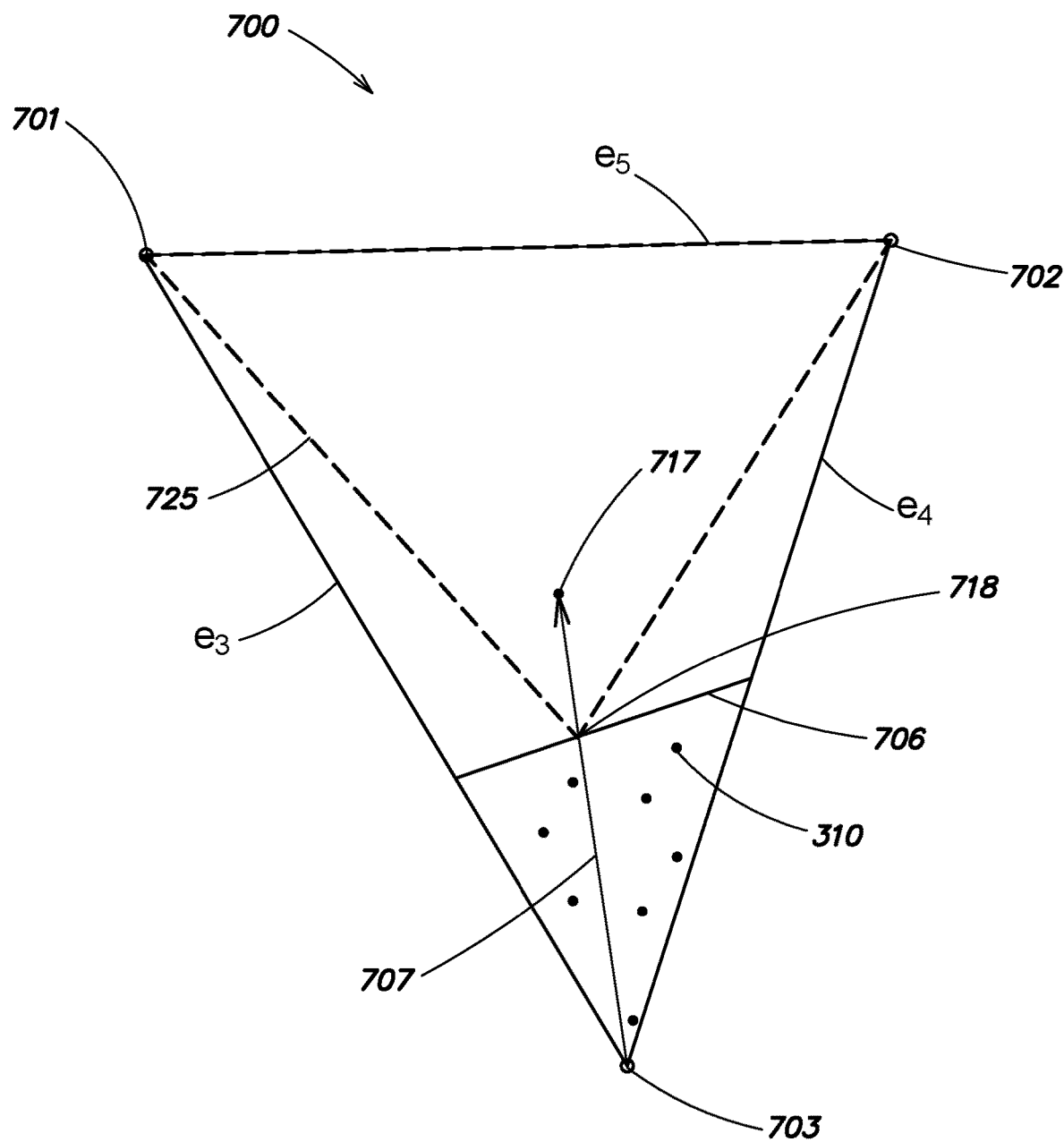
FIG. 8 is a diagram illustrating an example for determining a location to move an identified node of the another partially filled element of FIG. 7 to transform the another partially filled element to an empty element according to the one or more embodiments described herein.

After identifying the node, the procedure continues to step 525 and the mesh modifier module 118 moves the identified node to transform the partially filled element to an empty element. FIG. 8 is a diagram illustrating an example for determining a location to move an identified node of the partially filled element 700 of FIG. 7 to transform the partially filled element to an empty element according to the one or more embodiments described herein. Specifically, the mesh modifier module 118 may create a vector that connects the identified node, in this example node 703, with a centroid 717 of the partially filled element 700. The mesh modifier module 118 may compute the centroid of the partially filled element 700, which is a triangle, in a conventional manner and based on space dimension d, i.e., d=2 for 2-dimensional space and d=3 for 3-dimensional space, as known by those skilled in the art. The mesh modifier module 118 may connect the identified node, e.g., node 703, to the centroid to produce a connecting vector 707 as depicted in FIG. 8.

The mesh modifier module 118 may determine an intersection between the connecting vector 707 and a boundary of a bounding box that is larger, e.g., slightly larger, than the bounding box determined for the identified node, e.g., node 703. A larger bounding box may be utilized for the intersecting to ensure that no material points 310 are included in the transformed empty element. For example, an enlarging factor may be utilized to determine the larger bounding box. In this example, let it be assumed that the enlarging factor is 1.05. As such, a bounding box that is 1.05 times larger than the bounding box determined for node 703 may be utilized for the intersecting to ensure that the transformed empty element in fact does not include any material points 310. For example, the size of the bounding box determined for node 703 may be multiplied by the enlarging factor to determine the larger bounding box.

FIG. 8 includes a boundary 706 of the larger bounded box, e.g., a bounding box that is 1.05 times larger than the bounding box determined for node 703. To determine where the node 703 is to be moved to transform the partially element 700 to an empty element, the mesh modifier module 118 may determine an intersection of the connecting vector 707 and the boundary 706 of the larger bounded box. The mesh modifier module 118 may then move node 703 to location 718, e.g., the intersection, such that the partially filled element 700 is transformed to an empty element 725 as indicated by the dashed triangle as depicted in FIG. 8. The material points 310 that are no longer included in the transformed element, e.g., empty element 725, may be included in neighboring elements (not shown) of the background mesh. As depicted in FIG. 8, the horizontal edge of the transformed empty element 725 is the same as the edge $e_5$ of the partially filled element 700 in FIG. 7, however the other edges of the transformed empty element 725 are different than the edges (e.g., $e_3$ and $e_4$) of the partially filled element 700 in FIG. 7 because node 703 is moved to location 718.

Figure 9:
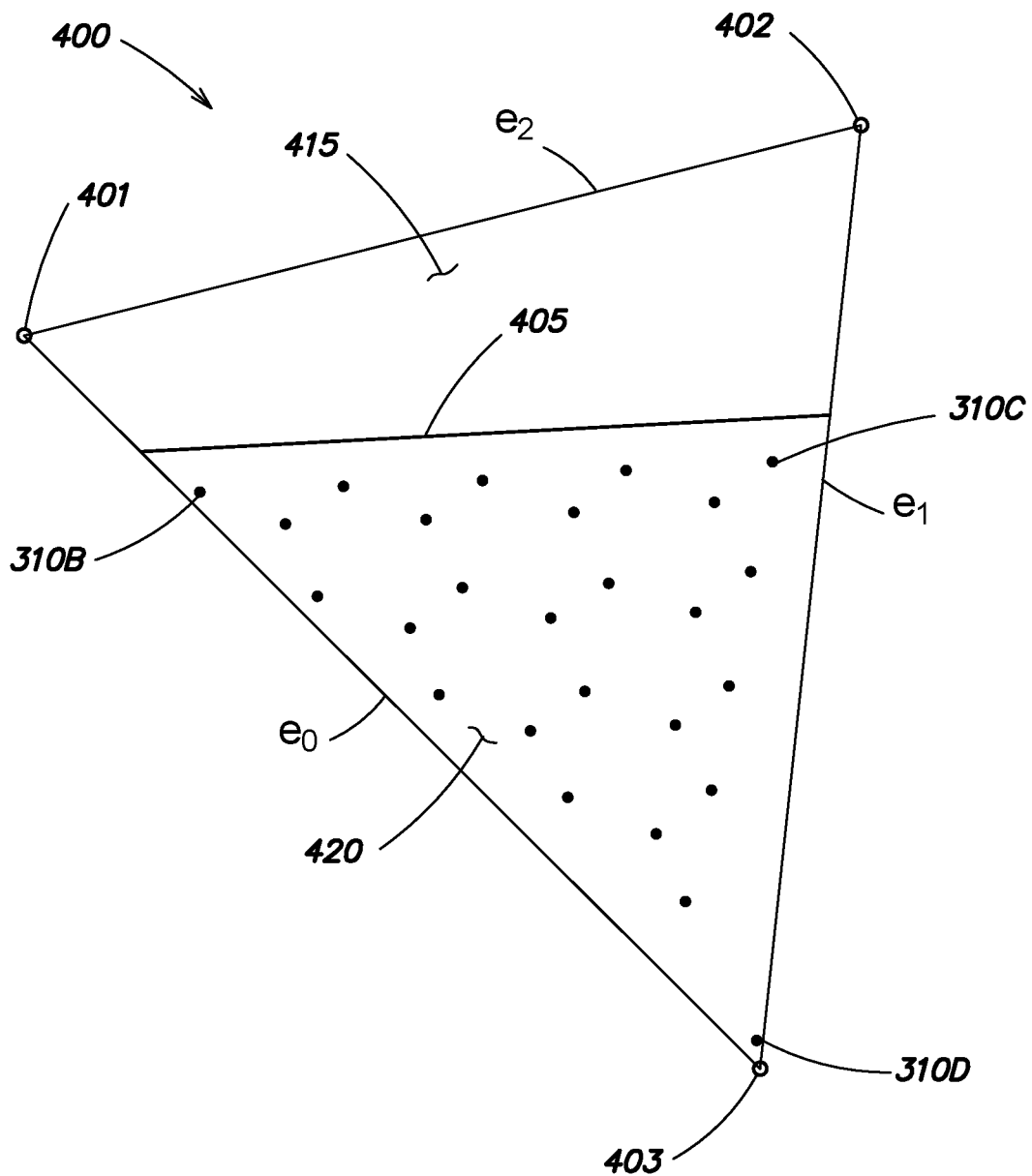
FIG. 9 is a diagram illustrating an example for identifying a node of the partially filled element of FIG. 4 that is farthest away from any of a plurality of material points in the partially filled element according to the one or more embodiments described herein.

Referring back to FIG. 5, if at step 510 it is determined that the partially filled element should be transformed to a filled element, the procedure continues to step 520 and the mesh modifier module 118 identifies a node, of a plurality of nodes of the partially filled element, that is to be moved to transform the partially filled element to a filled element. In an implementation, the mesh modifier module 118 may identify the node to be moved as the node that is farthest away from any of the material points in the partially filled element. FIG. 9 is a diagram illustrating an example for identifying a node of partially filled element 400 of FIG. 4 that is farthest away from any of a plurality of material points in the partially filled element 400 according to the one or more embodiments described herein; and The mesh modifier module 118 may determine a distance from each of the nodes 401, 402, and 403 to each of the plurality of material points 310 in partially filled element 400. The mesh modifier module 118 may then determine which material point of the plurality of material points is closest, i.e., shortest distance, to each of node 401, 402, and 403. For example, and with reference to FIG. 9, the mesh modifier module 118 may determine that material point 310B is closest to node 401, e.g., the shortest distance from node 401 to any of the material points in partially filled element 400 is from node 401 to material point 310B. In addition, the mesh modifier module 118 may determine that material point 310C is closest to node 402, e.g., the shortest distance from node 402 to any of the material points in partially filled element 400 is from node 402 to material point 310C. Further, the mesh modifier module 118 may determine that material point 310D is closest to node 403, e.g., the shortest distance from node 403 to any of the material points in partially filled element 400 is from node 403 to material point 310D.

The mesh modifier module 118 may then select the longest distance, of the three determined distances, to identify the node that is the farthest away from any of the material points 310 in partially filled element 400. Thus, and in this example, the mesh modifier module determines that the distance from node 402 to material point 310C is greater than the distance from node 401 to material point 310B and the distance from node 403 to material point 310C. Therefore, the mesh modifier module determines that node 402 is the node that is the farthest away from any of the material points 310 in partially filled element 400. Thus, node 402 is the identified node to be moved to transform the partially filled 400 element to a filled element.

Figure 10:
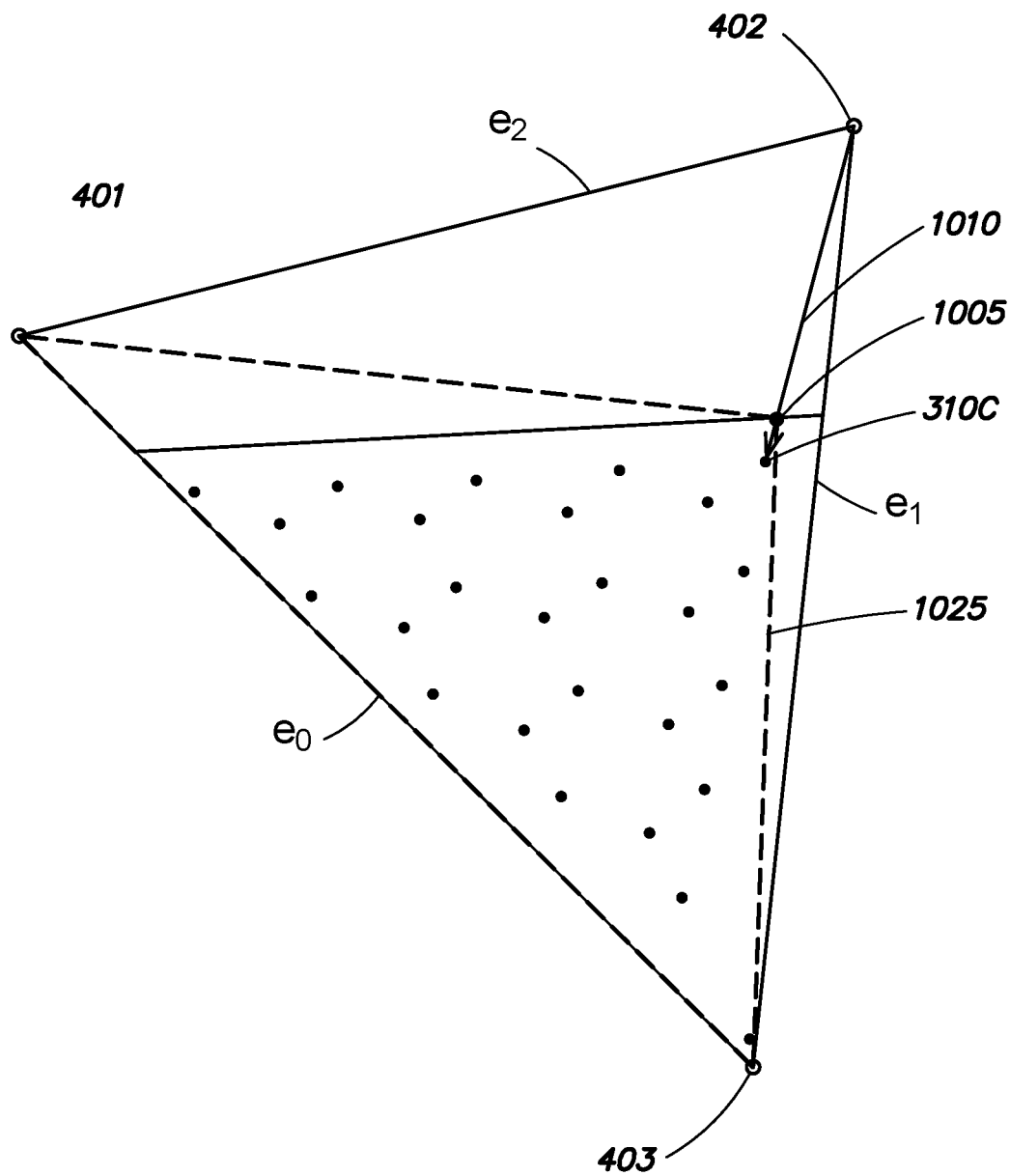
FIG. 10 is a diagram illustrating an example for determining a location to move an identified node of the partially filled element of FIG. 9 to transform the partially filled element to a filled element according to the one or more embodiments described herein.

The procedure continues to step 530 and the identified node is moved to a location to transform the partially filled element to a filled element. FIG. 10 is a diagram illustrating an example for determining a location to move an identified node of the partially filled element 400 of FIG. 9 to transform the partially filled element to a filled element according to the one or more embodiments described herein. Specifically, the mesh modifier module 118 may create a vector 1010 that connects the identified node, in this example node 402, to its closest material point, in this example 310C. The distance from node 402 to material point 310C may be multiplied by a reduction factor to ensure all material points are included in the transformed filled element. In this example, let it be assumed that the reduction factor is 0.95. As such, the distance from node 402 to material point 310C is reduced by 5 percent. The location on the vector that corresponds to 95% of the entire length of the vector from node 402 to material point 310C is location 1005 where node 402 is moved to transform the partially filled element 400 to a filled element. The mesh modifier module 118 may then move node 402 to location 1005 such that the partially filled element 400 is transformed to filled element 1025 as indicated by the dashed triangle as depicted in FIG. 10. An empty portion that is not included in the transformed element, e.g., filled element 1025, may be included in neighboring elements (not shown) of the background mesh.

The procedure may then loop or revert back to step 205 of FIG. 2 to ensure that all partially filled elements identified in the background mesh are transformed to either an empty element or a filled element. Continuing with the example of FIG. 10, let it be assumed that after partially filled element 400 is transformed to filled element 1025, the procedure continues to step 210 as described above and the mesh modifier module 118 determines that the fill ratio of filled element 1025 is less than the $U_T$. Accordingly, filled element 1025 may be marked at step 225, determined that it should be transformed again to a new filled element based on steps 505 and 510 of FIG. 5, and then transformed once again to a new filled element (not shown) based on steps 520 and 530 of FIG. 5.

Accordingly, the one or more embodiments iterate or loop through the procedures of FIGS. 2 and 5 until all partially filled elements of a background mesh are transformed to either empty elements that have a fill ratio that are less than or equal to the lower threshold value or filled elements that have fill ratios that are equal to or greater than the upper threshold value. After all partially filled elements are transformed based on the procedures of FIG. 2 and FIG. 5, the procedure will branch to step 220 of FIG. 2 and an updated background mesh is generated based on the transformations of partially filled elements to empty elements or filled elements.

The one or more embodiments described herein may implement a variety of different algorithms to prioritize the movement of selected nodes over other nodes. In addition or alternatively, the one or more embodiments described herein may move a shared node, i.e., a node shared between neighboring elements and that can be moved to different locations to transform the neighboring elements to empty elements and/or filled elements, to a shared location that takes into account the determined locations for each of the neighboring elements as will be described in further detail below.

Figure 11A:
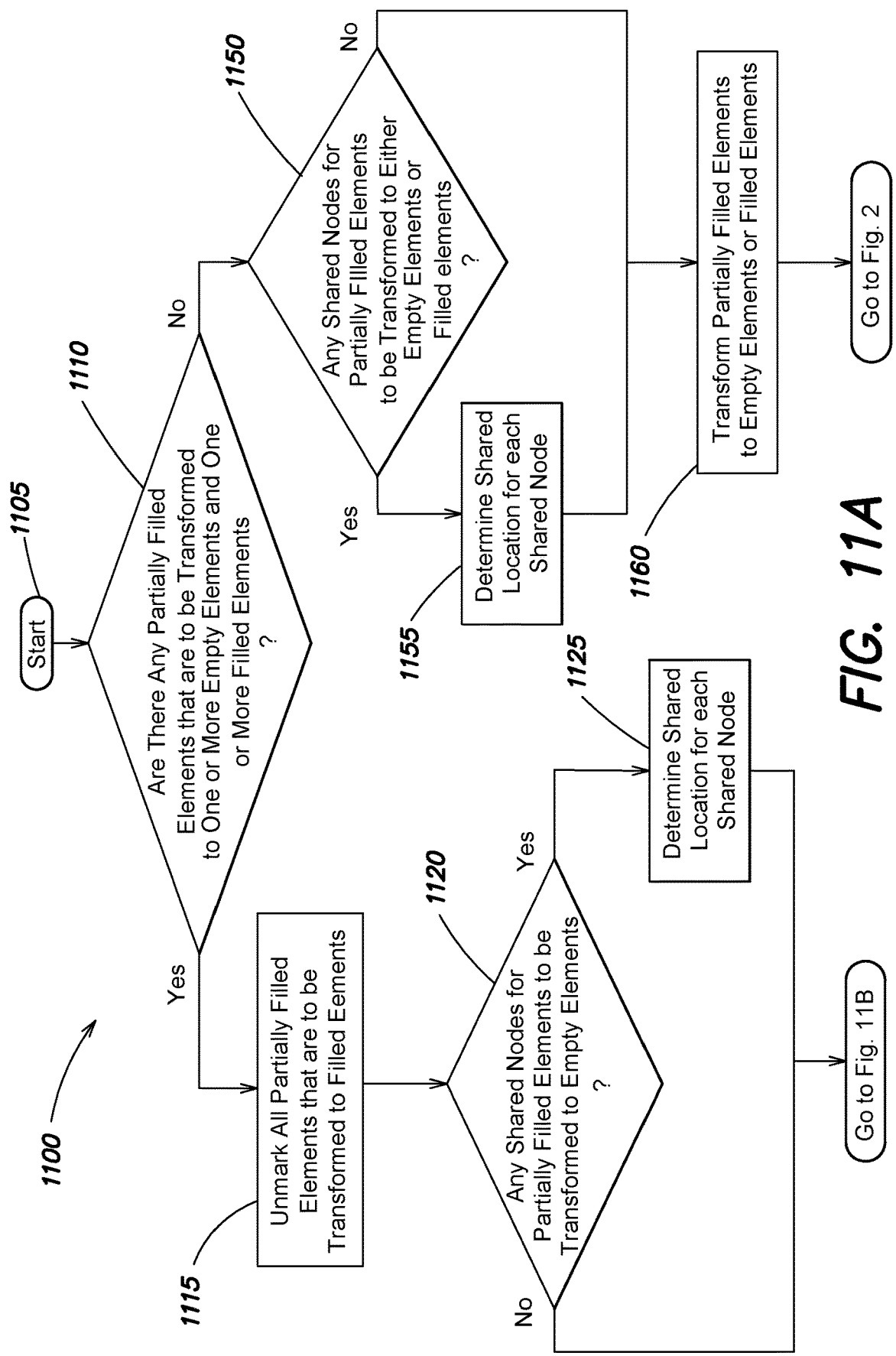
FIGS. 11A and 11B is a flow diagram of a sequence of steps for implementing one or more algorithms for transforming partially filled elements to empty elements and/or filled elements according to one or more embodiments described herein.
Figure 11B:
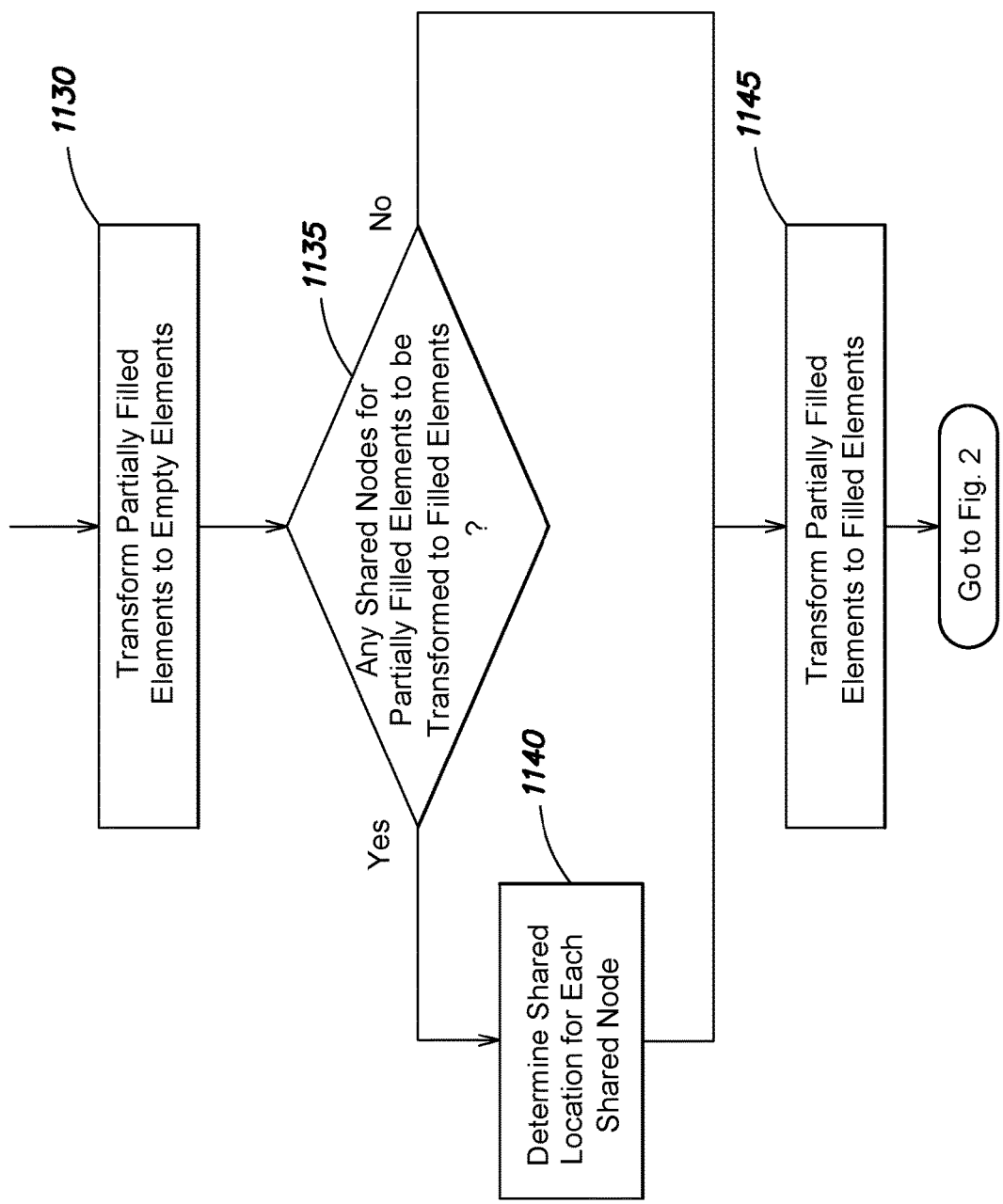

FIGS. 11A and 11B is a flow diagram of a sequence of steps for implementing one or more algorithms for transforming partially filled elements to empty elements and/or filled elements according to one or more embodiments described herein. The procedure 1100 starts at step 1105 and continues to step 1110 where the mesh modifier module 118 determines if there are partially filled elements of a background mesh that are to be transformed to both one or more empty elements and one or more filled elements. If they are partially filled elements to be transformed to both at step 1110, the procedure continues to step 1115 and the mesh modifier module 118 unmarks all partially filled elements that are to be transformed to filled elements. For example, the mesh modifier module 118 may remove from the list the unique identifiers for the partially filled elements that are to be transformed to filled elements after the mesh modifier module 118 determines if each partially filled element should be transformed to an empty element or a filled element at step 510.

Figure 12:
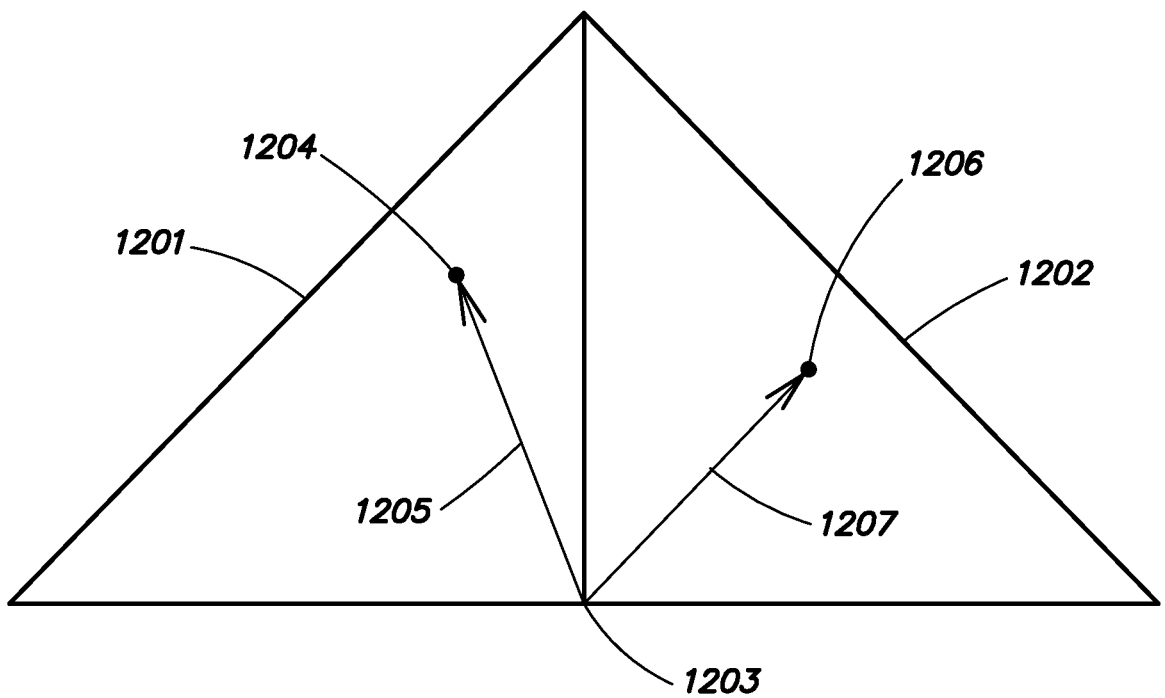
FIG. 12 is a diagram illustrating a shared node, of neighboring partially filled elements, that is to be moved to two different locations to transform the neighboring partially filled elements according to the one or more embodiments described herein.

The procedure continues to step 1120 and the mesh modifier module 118 determines if there are any shared nodes, of the partially filled elements that remain marked (e.g., remain in the list), that are shared by neighboring elements and to be moved to transform the neighboring elements to empty elements. FIG. 12 is a diagram illustrating a shared node, of neighboring partially filled elements, that is to be moved to two different locations to transform the neighboring partially filled elements according to the one or more embodiments described herein.

For simplicity and ease of understanding, the material points 310 have been excluded from neighboring elements 1201 and 1202, each of which may be a partially filled element. As depicted in FIG. 12, shared node 1203 is shared by neighboring elements 1201 and 1202 and can be moved to different locations to transform neighboring elements 1201 and 1202 to empty elements. Specifically, and as depicted in FIG. 12, shared node 1203 can be moved to location 1204 to transform neighboring element 1201 to an empty element. For example, the mesh modifier module 118 may identify shared node 1203 of neighboring element 1201 and may determine location 1204 based on steps 515 and 525 as described above with reference to FIG. 5. Vector 1205 may define a direction and distance from shared node 1203 to location 1204.

Additionally, and as depicted in FIG. 12, shared node 1203 can be moved to location 1206 to transform neighboring element 1202 to an empty element. For example, the mesh modifier module 118 may identify shared node 1203 of neighboring element 1202 and may determine location 1206 based on steps 515 and 525 as described above with reference to FIG. 5. Vector 1207 may define a direction and distance from shared node 1203 to location 1206.

Referring back to FIG. 11A, the procedure continues to step 1125 and the mesh modifier module 118 determines a shared location for each shared node of the partially filled elements to be transformed to empty elements, where the shared location for a shared node may be based on a consideration of each determined location for each of the neighboring elements. For example, and referring back to FIG. 12, the mesh modifier module 118 may determine a shared location for shared node 1203 based on an average of vectors 1205 and 1207.

The mesh modifier module 118 transforms, at step 1130, the partially filled elements, that are remained as marked, to empty elements based on moving each of the shared nodes and/or other nodes, e.g., non-shared nodes. For example, and if there are determined shared nodes at step 1120, the mesh modifier module 118 moves each of the shared nodes to the shared location instead of moving a shared node to a location determined individually for each of the neighboring elements as described above with reference to step 525 of FIG. 5. Additionally, the mesh modifier module 118 may move each other node, e.g., non-shared nodes, to the determined location as described above with reference to step 525 of FIG. 5. If there are no determined shared nodes at step 1120, the mesh modifier module 118 may move the non-shared nodes to the determined location as described above with reference to step 525 of FIG. 5. Accordingly, all partially filled elements, which are remained as marked, are transformed to empty elements by moving shared nodes and/or other nodes.

The procedure continues to step 1135 and the mesh modifier module 118 determines if there are any shared nodes, of partially filled elements marked to be transformed to filled elements, that are shared by neighboring elements and to be moved to transform the neighboring elements to filled elements. For example, and after all partially filled elements are transformed to empty elements at step 1130, the mesh modifier module 118 may mark the partially filled elements, to be transformed to filled elements, as described above with reference to step 225 of FIG. 2. The mesh modifier module 118 may identify shared nodes of partially filled elements to be transformed to filled elements in a similar manner as described above with reference to FIG. 12.

The procedure continues to step 1140 and the mesh modifier module 118 determines a shared location for each shared node of the partially filled elements to be transformed to filled elements, where the shared location for a shared node may be based on a consideration of each determined location for each of the neighboring elements in a similar manner as described above with reference to FIG. 12.

The mesh modifier module 118, at steps 1145, transforms all the partially filled elements to filled elements based on moving each of the shared nodes and/or other nodes, e.g., non-shared nodes. For example, and if there are determined shared nodes at step 1135, the mesh modifier module 118 moves each of the shared nodes to the shared location instead of moving a shared node to a location determined individually for each of the neighboring elements as described above with reference to step 530 of FIG. 5. Additionally, the mesh modifier module 118 may move each other node, e.g., non-shared nodes, to the determined location as described above with reference to step 530 of FIG. 5. If there are no determined shared nodes at step 1135, the mesh modifier module 118 may move the non-shared nodes to the determined location as described above with reference to step 530 of FIG. 5. Accordingly, all partially filled elements, which are marked to be transformed to filled elements, are transformed to filled elements by moving shared nodes and/or other nodes.

The procedure may then revert back to FIG. 2 and the updated background mesh, with only empty and filled elements transformed as described above and utilizing one or more algorithms, may be utilized for one or more time steps as described above with reference to step 220 of FIG. 2.

Referring back to FIG. 11A, if at step 1110 it is determined that there are only partially filled elements to be transformed to empty elements or filled elements, the procedure continues to step 1150 and the mesh modifier module 118 determines if there are any shared nodes, of partially filled elements marked to be transformed to either empty elements or filled elements, that are shared by neighboring elements and to be moved to transform the neighboring elements to empty elements or filled elements as described above with reference to steps 1120 and 1135 of FIGS. 11A and 11B.

The procedure continues to step 1155 and the mesh modifier module 118 determines a shared location for each shared node of the partially filled elements to be transformed to either empty elements or a filled elements as describe above with reference to steps 1125 and 1140 of FIGS. 11A and 11B, where the shared location for a shared node may be based on a consideration of each determined location for each of the neighboring elements.

The mesh modifier module 118, at steps 1160, transform all the partially filled elements to either empty elements or filled elements based on moving each of the shared nodes and/or other nodes, e.g., non-shared nodes. For example, and if there are determined shared nodes at step 1150, the mesh modifier module 118 moves each of the shared nodes to the shared location instead of moving a shared node to a location determined individually for each of the neighboring elements as described above with reference to step 530 of FIG. 5. Additionally, the mesh modifier module 118 may move each other node, e.g., non-shared nodes, to the determined location as described above with reference to step 530 of FIG. 5. If there are no determined shared nodes at step 1150, the mesh modifier module 118 may move the non-shared nodes to the determined location as described above with reference to step 530 of FIG. 5. Accordingly, all partially filled elements, which are marked to be transformed to either empty or filled elements, are transformed to empty elements by moving shared nodes and/or other nodes.

The procedure may then revert back to FIG. 2 and the updated background mesh, with only empty and filled elements transformed as described above and utilizing one or more algorithms, may be utilized for one or more time steps as described above with reference to step 220 of FIG. 2.

Figure 13:
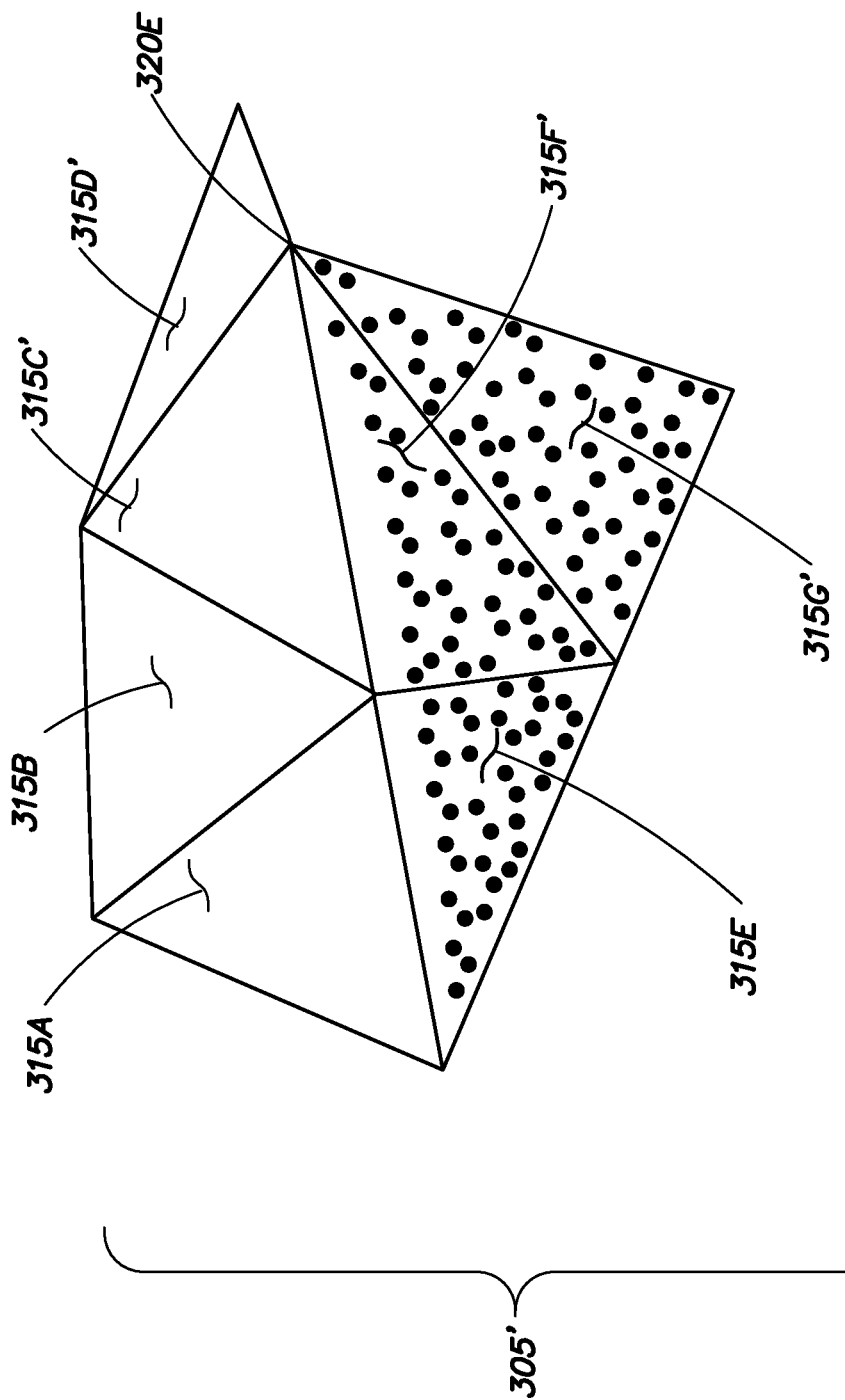
FIG. 13 is a diagram illustrating example output data that includes an updated background mesh that may be generated from the background mesh of FIG. 3 and based on transformations of partially filled elements to empty elements and/or filled elements according to one or more embodiments described.

FIG. 13 is a diagram illustrating example output data that includes an updated background mesh 305' that may be generated from the background mesh 305 of FIG. 3 and based on transformations of partially filled elements to empty elements and/or filled elements according to one or more embodiments described. With reference to FIG. 3, and before each of the partially filled elements are transformed to either an empty element or a filled element according to the one or more embodiments described herein, the mesh modifier module 118 determines that elements 315A and 315B are defined as being empty based on the procedure of FIG. 2. In addition, the mesh modifier module 118 determines that elements 315E, 315F, and 315G are defined as being filled based on the procedure of FIG. 2. Further, elements 315C and 315D are defined as being partially filled and are marked, e.g., the unique identifiers of elements 315C and 315D are added to the list, based on the procedure of FIG. 2.

According to the one or more embodiments described herein, the mesh modifier module 118 may determine that partially filled elements 315C and 315D are to be transformed to empty elements based on the procedure of FIG. 5. Additionally, the mesh modifier module 118 may identify shared node 320E as the node to be moved and move the node 320E from the location as depicted in FIG. 3 to the location as depicted in FIG. 13 based on the procedure of FIG. 5 and FIGS. 11A and 11B. As such, partially filled elements 315C and 315D of FIG. 3 are transformed to empty elements 315C' and 315D' as depicted in FIG. 13 and based on the procedure of FIG. 5 and FIGS. 11A and 11B. Additionally, the material points within elements 315C and 315D as depicted in FIG. 3 are included in elements 315F' and 316G' as depicted in FIG. 13, where elements 315F' and 316G' are transformed in shape and size based on the movement of shared node 320 as described above with reference to FIG. 5 and FIGS. 11A and 11B. Accordingly, the updated background mesh 305', that is generated according to the one or more embodiments described herein, includes only empty elements 315A, 315B, 315C', and 316D' that have fill ratios that are less than or equal to the lower threshold value, and filled elements 315E, 315F', and 315G' that have fill ratios that are equal to or greater than the upper threshold value.

The updated background mesh 305' may be utilized to perform one or more calculations during one or more time steps to simulate, in a modeling/simulation environment, a behavior of a physical material/object that exhibits deformations. For example the information (e.g., mass, volume, stress, state variables etc.) of the material points 310 representing the physical material/object that exhibits deformations may be mapped to the nodes of the updated background mesh 305' utilizing, for example, shape functions. Solver 119 may perform calculations, e.g., equilibrium calculations, for a model in a modeling/simulation environment that represents the physical material/object.

By using the updated background mesh 305, that includes only empty and filled elements to perform the calculations during time steps of a simulation, the one or more embodiments described herein improve accuracy of results of the calculations and/or stability to perform the calculations during simulation when compared to conventional techniques that, for example, may utilize a background mesh with partially filled elements that may lead to inaccurate results and/or instability. Because the accuracy of results and stability during simulation are improved, the size of the time steps may be increased during simulation, which in turn results in a reduced number of calculations having to be performed during the simulation (i.e., less number of calculations have to be performed when compared to conventional techniques). Because less calculations have to be performed, the one or more embodiments described herein conserve processing resources of a computer, e.g., device, that executes the simulation and performs the calculations. As such, the one or more embodiments described herein provide an improvement to a computer, e.g., a device that executes the simulation and performs the calculations, itself.

It should be understood that various adaptations and modifications may be readily made to what is described above, to suit various implementations and environments. For example, although the flow diagrams of FIGS. 2, 5, and 11 are shown to be separate for clarity and ease of understanding, it is expressly contemplated that a single flow diagram including the steps of FIGS. 2, 5, and 11, may be implemented according to the one or more embodiments described herein. Additionally, while it is discussed above that many aspects of the techniques may be implemented by specific software processes (e.g., of an application stored in a non-transitory electronic device readable medium for execution on one or more processors) or on specific hardware devices, it should be understood that some or all of the techniques may also be implemented by different software on different hardware. In addition to general-purpose computing devices/electronic devices, the hardware may include specially configured logic circuits and/or other types of hardware components. Above all, it should be understood that the above descriptions are meant to be taken only by way of example.

What is claimed is:

1. A system for modifying a mesh for a material point method that is used for geotechnical engineering, the system comprising:
   an application executing on a computing device, the application configured to:
   identify at least one partially filled element of the mesh that includes a plurality of elements that are connected by a plurality of nodes and further includes a plurality of material points, wherein the partially filled element includes an empty portion and a filled portion, and the at least one partially filled element is determined to be partially filled based on an area or a volume of the filled portion relative to an overall area or an overall volume of the partially filled element; and
   move a selected node, of a set of nodes that define a perimeter of the at least one partially filled element, from a first location to a second location in the mesh to generate an updated mesh,
      wherein moving the selected node decreases a size of the filled portion of the at least one partially filled element and transforms the at least one partially filled element to an empty element, or
      wherein moving the selected node decreases a size of the empty portion of the at least one partially filled element and transforms the partially filled element to a filled element.

2. The system of claim 1, wherein the application further configured to:
   utilize the updated mesh with information from the plurality of material points during one or more time steps to simulate, in a simulation environment, a behavior of a physical material or object that exhibits deformations.

3. The system of claim 1, wherein
   a first fill ratio for the partially filled element, that is based on the area or the volume of the filled portion of the partially filled element relative to the overall area or the overall volume of the partially filled element, is between a range defined by a lower threshold value and an upper threshold value;
   a second fill ratio, for the empty element when the partially filled element is transformed to the empty element, is equal to or less than the lower threshold value; and
   a third fill ratio, for the filled element when the partially filled element is transformed to the filled element, is equal to or greater than the higher threshold value.

4. The system of claim 1, wherein the application is further configured to:
   determine that the at least one partially filled element is to be transformed to the empty element based on a determination that at least one node, of the set of nodes that define the perimeter of the at least partially filled element, would have to move a distance that is less than a distance threshold value to transform the partially filled element to the empty element.

5. The system of claim 1, wherein the application is further configured to:
   determine that the at least one partially filled element is to be transformed to the filled element based on a determination that all nodes, of the set of nodes that define the perimeter of the at least one partially filled element, would have to move a distance that is equal to or greater than a distance threshold value to transform the partially filled element to the empty element.

6. The system of claim 1, wherein the application, when transforming the at least one partially filled element to the empty element, is further configured to:
   determine a bounding box for each node of the set of nodes that define the perimeter of the at least one partially filled element, where each bounding box includes all of the plurality of material points;
   determine a smallest bounding box of the bounding boxes generated for the set of nodes; and
   determine that the selected node, of the set of nodes, is to be moved based on a determination that the smallest bounding box correspond to the selected node.

7. The system of claim 1, wherein the application, when transforming the at least one partially filled element to the filled element, is further configured to:
   determine that the selected node, of the set of nodes, is to be moved based on the selected node being a farthest distance away from any material point of the plurality of material points.

8. A method for modifying a mesh for a material point method that is used for geotechnical engineering, the system comprising:
   identifying, by an application executing on a computing device, at least one partially filled element of the mesh that includes a plurality of elements that are connected by a plurality of nodes and further includes a plurality of material points, wherein the partially filled element includes an empty portion and a filled portion, and the at least one partially filled element is determined to be partially filled based on an area or a volume of the filled portion relative to an overall area or an overall volume of the partially filled element; and
   moving, by the application, a selected node of a set of nodes that define a perimeter of the at least one partially filled element, where the selected node is moved from a first location to a second location in the mesh to generate an updated mesh,
      wherein moving the selected node decreases a size of the filled portion of the at least one partially filed element and transforms the at least one partially filled element to an empty element, or
      wherein moving the selected node decreases a size of the empty portion of the at least one partially filled element and transforms the partially filled element to a filled element.

9. The method of claim 8, further comprising:
   utilizing, by the application, the updated mesh with information from the plurality of material points during one or more time steps to simulate, in a simulation environment, a behavior of an object that experiences deformations.

10. The method of claim 8, wherein
   a first fill ratio for the partially filled element, that is based on the area or the volume of the filled portion of the partially filled element relative to the overall area or the overall volume of the partially filled element, is between a range defined by a lower threshold value and an upper threshold value;
   a second fill ratio, for the empty element when the partially filled element is transformed to the empty element, is equal to or less than the lower threshold value; and
   a third fill ratio, for the filled element when the partially filled element is transformed to the filled element, is equal to or greater than the higher threshold value.

11. The method of claim 8, further comprising:
   determining, by the application, that the at least one partially filled element is to be transformed to the empty element based on a determination that at least one node, of the set of nodes that define the perimeter of the at least partially filled element, would have to move a distance that is less than a distance threshold value to transform the partially filled element to the empty element.

12. The method of claim 8, further comprising:
   determining, by the application, that the at least one partially filled element is to be transformed to the filled element based on a determination that all nodes, of the set of nodes that define the perimeter of the at least one partially filled element, would have to move a distance that is equal to or greater than a distance threshold value to transform the partially filled element to the empty element.

13. The method of claim 8, when transforming the at least one partially filled element to the empty element, the method further comprising:
   determining, by the application, a bounding box for each node of the set of nodes that define the perimeter of the at least one partially filled element, where each bounding box includes all of the plurality of material points;
   determining, by the application, a smallest bounding box of the bounding boxes generated for the set of nodes; and
   determining, by the application, that the selected node, of the set of nodes, is to be moved based on a determination that the smallest bounding box correspond to the selected node.

14. The method of claim 8, when transforming the at least one partially filled element to the filled element, the method further comprising:
   determining, by the application, that the selected node of the set of nodes is to be moved based on the selected node being a farthest distance away from any material point of the plurality of material points.

15. One or more non-transitory computer-readable media, having stored thereon instructions that when executed by a computing device, cause the computing device to perform operations comprising:
   identifying at least one partially filled element of a mesh that includes a plurality of elements that are connected by a plurality of nodes and further includes a plurality of material points, wherein the partially filled element includes an empty portion and a filled portion, and the at least one partially filled element is determined to be partially filled based on an area or a volume of the filled portion relative to an overall area or an overall volume of the partially filled element; and
   moving a selected node, of a set of nodes that define a perimeter of the at least one partially filled element, from a first location to a second location in the mesh to generate an updated mesh,
      wherein moving the selected node decreases a size of the filled portion of the at least one partially filed element and transforms the at least one partially filled element to an empty element, or
      wherein moving the selected node decreases a size of the empty portion of the at least one partially filled element and transforms the partially filled element to a filled element.

16. The one or more non-transitory computer-readable media of claim 15, wherein performing the operation comprises:
   utilizing the updated mesh with information from the plurality of material points during one or more time steps to simulate, in a simulation environment, a behavior of an object that experiences deformations.

17. The one or more non-transitory computer-readable media of claim 15, wherein
   a first fill ratio for the partially filled element, that is based on the area or the volume of the filled portion of the partially filled element relative to the overall area or the overall volume of the partially filled element, is between a range defined by a lower threshold value and an upper threshold value;

a second fill ratio, for the empty element when the partially filled element is transformed to the empty element, is equal to or less than the lower threshold value; and a third fill ratio, for the filled element when the partially filled element is transformed to the filled element, is equal to or greater than the higher threshold value.

18. The one or more non-transitory computer-readable media of claim 15, wherein performing the operation comprises:

determining that the at least one partially filled element is to be transformed to the empty element based on a determination that at least one node, of the set of nodes that define the perimeter of the at least partially filled element, would have to move a distance that is less than a distance threshold value to transform the partially filled element to the empty element.

19. The one or more non-transitory computer-readable media of claim 15, wherein the performing the operation comprises:

determining that the at least one partially filled element is to be transformed to the filled element based on a determination that all nodes, of the set of nodes that define the perimeter of the at least one partially filled element, would have to move a distance that is equal to or greater than a distance threshold value to transform the partially filled element to the empty element.

20. The one or more non-transitory computer-readable media of claim 15, wherein the performing the operation, when transforming the at least one partially filled element to the empty element, comprises:

determining a bounding box for each node of the set of nodes that define the perimeter of the at least one partially filled element, where each bounding box includes all of the plurality of material points;

determining a smallest bounding box of the bounding boxes generated for the set of nodes; and determining that the selected node, of the set of nodes, is to be moved based on a determination that the smallest bounding box correspond to the selected node.

\* \* \* \* \*